(12) United States Patent
Schuele et al.

(10) Patent No.: US 11,908,841 B2
(45) Date of Patent: Feb. 20, 2024

(54) BACK EMISSION DISPLAY

(71) Applicant: eLux Inc., Vancouver, WA (US)

(72) Inventors: Paul J. Schuele, Washougal, WA (US); Kurt Ulmer, Vancouver, WA (US); Kenji Sasaki, West Linn, OR (US); Jong-Jan Lee, Camas, WA (US)

(73) Assignee: eLux, Inc., Vancouver, WA (US)

( * ) Notice: Subject to any disclaimer, the term of this patent is extended or adjusted under 35 U.S.C. 154(b) by 201 days.

(21) Appl. No.: 17/326,779

(22) Filed: May 21, 2021

(65) Prior Publication Data

US 2022/0149254 A1 May 12, 2022

Related U.S. Application Data

(63) Continuation-in-part of application No. 17/101,016, filed on Nov. 23, 2020, which is a continuation-in-part of application No. 16/875,994, filed on May 16, 2020, now Pat. No. 11,296,059, which is a continuation-in-part of application No. 16/846,493, filed on Apr. 13, 2020, now Pat. No. 11,251,166, which is a continuation-in-part of application No. 16/727,186, filed on Dec. 26, 2019, now Pat. No. 11,145,787, which is a continuation of application No. 16/406,196, filed on May 8, 2019, now Pat. No. 10,643,981, which is a continuation-in-part of application No. 16/406,080,
(Continued)

(51) Int. Cl.
*H01L 25/075* (2006.01)
*H01L 33/48* (2010.01)
*H01L 33/38* (2010.01)

(52) U.S. Cl.
CPC .......... *H01L 25/0753* (2013.01); *H01L 33/38* (2013.01); *H01L 33/486* (2013.01); *H01L 2933/0033* (2013.01); *H01L 2933/0066* (2013.01)

(58) Field of Classification Search
CPC ... H01L 25/0753; H01L 25/167; H01L 33/38; H01L 33/486; H01L 33/0095; H01L 33/20; H01L 33/60; H01L 33/62; H01L 2933/0033; H01L 2933/0066; H01L 2933/0016; H01L 2933/0058; H01L 2224/16225; H01L 24/00; H01L 21/7806; H01L 21/67144
USPC .......................................................... 257/88
See application file for complete search history.

(56) References Cited

U.S. PATENT DOCUMENTS

2008/0093607 A1* 4/2008 Feng ..................... H01L 33/483
257/82
2008/0135956 A1* 6/2008 Huber ..................... H01F 1/083
428/209

(Continued)

*Primary Examiner* — Dzung Tran
(74) *Attorney, Agent, or Firm* — Law Office of Gerald Maliszewski; Gerald Maliszewski

(57) ABSTRACT

Disclosed herein is a micro light emitting diode (microLED) display structure with emission from the back side of a transparent substrate, which can be manufactured by fluidic assembly. The architecture allows microLED displays or display tiles to be fabricated simply, with processing and interconnection only on one side of the backplane. The structure may incorporate reflectors in the fluidic assembly structures to direct substantially all of the emitted light toward the viewer. Also disclosed are microLEDs and emission backplanes designed to support a back emission display.

42 Claims, 20 Drawing Sheets

Related U.S. Application Data filed on May 8, 2019, now Pat. No. 10,804,426, which is a continuation-in-part of application No. 16/125,671, filed on Sep. 8, 2018, now Pat. No. 10,516,084, which is a continuation-in-part of application No. 15/838,536, filed on Dec. 12, 2017, now Pat. No. 10,242,977, which is a continuation-in-part of application No. 15/722,037, filed on Oct. 2, 2017, now Pat. No. 10,543,486, which is a continuation-in-part of application No. 15/691,976, filed on Aug. 31, 2017, now Pat. No. 10,535,640, which is a continuation-in-part of application No. 15/440,735, filed on Feb. 23, 2017, now Pat. No. 10,381,335, which is a continuation-in-part of application No. 15/416,882, filed on Jan. 26, 2017, now Pat. No. 10,446,728, which is a continuation-in-part of application No. 15/413,053, filed on Jan. 23, 2017, now Pat. No. 10,520,769, which is a continuation-in-part of application No. 15/412,731, filed on Jan. 23, 2017, now Pat. No. 10,418,527, which is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, which is a continuation-in-part of application No. 15/197,266, filed on Jun. 29, 2016, now Pat. No. 10,249,599, said application No. 15/410,001 is a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, which is a continuation-in-part of application No. 14/680,618, filed on Apr. 7, 2015, now Pat. No. 10,115,862, which is a continuation-in-part of application No. 14/530,230, filed on Oct. 31, 2014, now abandoned.

(56) References Cited

U.S. PATENT DOCUMENTS

| | | | | |
|---|---|---|---|---|
| 2011/0204395 | A1* | 8/2011 | Hong | H01L 33/62 |
| | | | | 257/E33.048 |
| 2011/0284822 | A1* | 11/2011 | Jung | H01L 33/56 |
| | | | | 257/E33.012 |
| 2013/0313591 | A1* | 11/2013 | Shimada | H01L 33/36 |
| | | | | 257/98 |
| 2014/0339580 | A1* | 11/2014 | Park | H01L 33/08 |
| | | | | 257/90 |
| 2016/0343901 | A1* | 11/2016 | Shur | H01S 5/0234 |
| 2017/0062492 | A1* | 3/2017 | Bae | H01L 25/167 |
| 2017/0142874 | A1* | 5/2017 | Pourchet | H01L 21/6836 |
| 2017/0263828 | A1* | 9/2017 | Mao | H10K 59/121 |

* cited by examiner

BACK EMISSION DISPLAY

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to emissive displays and, more particularly, to a back emission display and well as supporting light emitting diodes (LEDs) and back emission backplanes.

2. Description of the Related Art

A red-green-blue (RGB) display is composed of pixels that emit light at three wavelengths corresponding to the visible colors red, green, and blue. The RGB components of the pixel, each of which is referred to as a sub-pixel, are energized in a systematic way to additively produce the colors of the visible spectrum. There are several display types that produce the RGB images in different ways. Liquid crystal displays (LCD) are the most prevalent technology, and they produce RGB images by shining a white light source, typically a phosphor produced white LED, through a color filter of a subpixel. Some portion of the white light spectrum is absorbed and some transmitted through the color filter. As a consequence, the efficiency of an LCD display may be less than 4% and the contrast ratio is limited by light leaking through the cell. Organic light emitting diode (OLED) displays produce RGB light by direct emission of each of those wavelengths of light at a pixel level within the organic light emitting material. OLED displays are direct emitting so the contrast ratio is high, but the organic materials can be subject to long-term degradation causing image burn-in.

A third display technology and the one addressed herein is the microLED display, which uses micro-sized (5 to 150 μm diameter) inorganic LEDs for direct emission of light at the subpixel level. Inorganic microLED displays have several advantages over competing displays. When compared with LCD displays, the microLED display has very high contrast over 50,000:1 and higher efficiency. Unlike the OLED display, inorganic LEDs do not suffer burn-in effects and the achievable brightness is significantly higher.

MicroLEDs are fabricated from metalorganic chemical vapor deposition (MOCVD) wafers like those used to make LEDs for general lighting, which makes the cost per device very low but also introduces issues unique to microLED technology. MicroLEDs are fabricated on high-temperature substrates such as sapphire (GaN on sapphire for blue and green emission) and/or on GaAs (AlGaInP on GaAs for red emission) so they must be transferred to a second substrate that will form the display. The second substrate can be either glass or flexible transparent plastic with thin film transistors to power and control the microLEDs. For the sake of brevity, an exemplary glass substrate is described herein, but the equivalent architecture applied to transparent plastic substrates would be obvious to one skilled in the art. The conventional method of microLED transfer is a mechanical pick-and-place system that uses a pickup head to capture a device from a carrier and position it on the display substrate while making contact with the control circuits. Other mechanical transfer methods that use a stamp or the like to transfer a block of microLEDs at the same time are referred to as mass transfer. An alternate technology described herein uses a fluidic assembly process to position and connect the microLEDs.

Briefly stated, the fluidic assembly process applies a liquid suspension of microLEDs to a substrate with an array of trap sites (wells) and moves the suspension to cause the microLEDs to be assembled in the trap sites. The microLEDs and display backplane are designed with sizes, shapes, and electrode configurations to facilitate assembly as has been described in U.S. Pat. No. 10,804,426, entitled PLANAR SURFACE MOUNT MICRO-LED FOR FLUIDIC ASSEMBLY, and in U.S. Pat. No. 10,643,981, entitled EMISSIVE DISPLAY SUBSTRATE FOR SURFACE MOUNT MICRO-LED FLUIDIC ASSEMBLY, both of which are incorporated herein by reference.

FIG. 1 is a partial cross-sectional view of a conventional front emitting microLED display (prior art). The conventional microLED display, however assembled, places the device on the top surface of the display backplane that carries the interconnects and TFT circuitry needed to energize the microLED. Emission to the viewer is from the front side of the backplane as shown. Whether the microLEDs are assembled by fluidic assembly or some other transfer technique, the electrical interface to the substrate must be at the edge of the display or connected to the back side of the backplane to avoid interference with the displayed image. Especially in the case of tiled displays, where the edges of each tile must abut to form a seamless large area display, array connections to power and drive circuitry are made on the back side of the backplane.

FIG. 2 is a partial cross-sectional view of a front emitting display with drive electronics accessed by a through hole via, bonded to a flexible printed circuit (FPC) (prior art). In practice, routing from the microLED array to the back side is often carried out by forming through hole vias, with plated metal in laser drilled via holes, connected to the external drive electronics by means of a FPC as shown.

FIG. 3 is a partial cross-sectional view of a front emitting display with drive electronics accessed by edge wrap electrodes bonded to a silicon chip with solder bumps (prior art). Alternatively, edge connections on each tile can be formed by metal lines that wrap around the edge of each tile to metal lines on the back side as shown. Both the methods of FIGS. 2 and 3 are complex with processing on both sides of the backplane, so integration of the 2-sided interconnect scheme with the TFT fabrication and microLED assembly is quite difficult. In addition, the laser cut vias are formed one at a time, so the cost becomes prohibitive for consumer displays requiring millions of vias.

Because of the complexity, cost, and yield loss of processing on both sides of the display backplane it would be desirable to make a back emitting display with microLED emitters, transistors, and connections to external circuitry all fabricated on one side of the substrate.

FIG. 4 is a partial cross-sectional view depicting a front emitting microLED structure made by fluidic assembly showing light escaping from a sub-pixel into the trap material (prior art). The front emitting display fabricated by fluidic assembly uses a transparent material to form the substrate and trap structures, so some of the light emitted by a microLED can be injected into these structures as shown in U.S. Pat. No. 10,516,084 (FIG. 16A), entitled ENCAPSULATED FLUID ASSEMBLY EMISSIVE ELEMENTS, which is incorporated herein by reference. Light injected into the substrate can travel a long distance laterally due to total internal reflection (TIR) before it is scattered. The undesirable result is that light from one pixel can emerge from an adjacent pixel, effectively contaminating the image of the adjacent pixel. In U.S. Pat. No. 10,516,084 it is suggested that an absorbing or reflective polymer encapsulant can be added to the microLED structure to prevent this light leakage. However, because a microLED encapsulant may potentially have an effect on the fluidic assembly process, it would be desirable to incorporate a reflective light management structure into the backplane of the back emitting display.

SUMMARY OF THE INVENTION

Disclosed herein is a micro-light emitting diode (microLED) display structure with emission from the back side of a transparent substrate, which can be manufactured by fluidic assembly. The architecture allows microLED displays or display tiles to be fabricated simply, with processing and interconnection only on one side of the backplane. The structure may incorporate reflectors to direct substantially all of the emitted light toward the viewer. Also disclosed are microLEDs and transparent backplanes designed to support a back emission display.

Accordingly, a back emission microLED is provided with a first semiconductor layer doped with either an n or p type dopant. The first doped semiconductor layer has a first top surface formed in a first plane and a second top surface formed in an overlying second plane, as well as a bottom emission surface. The first doped semiconductor second top surface is formed in either the perimeter or the center of the first doped semiconductor layer. A multiple quantum well (MQW) layer has a top surface formed in a third plane overlying the first doped semiconductor second top surface. A second oppositely doped semiconductor layer has a top surface in a fourth plane, overlying the MQW layer. An electrical insulator overlies the top surface of the second doped semiconductor, as well as the first top surface of the first doped semiconductor and intervening sidewalls. A first electrode overlies and is connected to the first doped semiconductor first top surface through a first via, forming a substrate interface surface in at least a fifth plane. A second electrode overlies and is connected to the second doped semiconductor through a second via, forming a substrate interface surface in a sixth plane. The fifth plane may be either coplanar with the sixth plane, non-coplanar with the sixth plane, or include segments that are both coplanar and non-coplanar. In one aspect, an electrically conductive orientation keel overlies the second electrode.

If the first doped semiconductor first top surface is formed in a perimeter region of the first doped semiconductor layer, then typically a plurality of first vias overlies the perimeter region, and may be connected to the first doped semiconductor. Otherwise, if the first doped semiconductor second top surface is formed in a perimeter region of the first doped semiconductor layer, then a plurality of second vias may overlie the perimeter region, and are connected to the second doped semiconductor.

Also provided is a back emission display backplane formed from a transparent substrate with a top surface. A power interface layer has a bottom surface overlying the substrate top surface, a top surface with a plurality of first electrical contacts and a plurality of second electrical contacts, and a plurality of apertures formed between a top surface and the bottom surface. An emission layer has a bottom surface overlying the power interface layer top surface and is made up of a plurality of sub-pixel regions. Each sub-pixel region includes a well (trap site) overlying a corresponding aperture, a first conductive via electrically connected to a corresponding first electrical contact, and a second conductive via electrically connected to a corresponding second electrical contact. In one aspect, each sub-pixel includes a plurality of wells with corresponding conductive vias. In another aspect, each second conductive via in the emissive layer is formed as a ring overlying a corresponding second electrical contact, with an optically reflective (e.g., silver (Ag)) interior surface.

In the case of an active matrix (AM) design, the power interface layer includes a plurality of control circuits, typically formed from at least two thin-film transistors (TFTs). Each control circuit has a first interface electrically connected to a corresponding second electrical contact, and a second interface. An electrically conductive power signal line is formed in the power interface layer top surface and is electrically connected to the control circuit second interface. An electrically conductive column line is also formed in the power interface layer top surface and is electrically connected to first electrical contacts.

Also provided is a back emission display made up of a transparent substrate, a power interface layer, and emission layer, as described above. In addition, a back emission microLED occupies each well. The microLED has an emissive bottom surface overlying a corresponding aperture, a first electrode formed on a microLED top surface, and a second electrode formed on the microLED top surface. A first electrical interconnect is formed on the emission layer top surface electrically connecting each first conductive via to a corresponding microLED first electrode. An insulating layer overlies the emission layer top surface and includes a third conductive via electrically connected to a corresponding second conductive via on the emission layer top surface, and a fourth conductive via electrically connected to a corresponding microLED second electrode. A second electrical interconnect is formed on the insulating layer top surface electrically connecting each third conductive via to a corresponding fourth conductive via. In one aspect, the fourth conductive via is an electrically conductive orientation keel electrically connected to, and overlying the second electrode of the microLED.

Additional details of the above-described devices, and well as associated fabrication processes are provided below.

DETAILED DESCRIPTION

Figure 1:
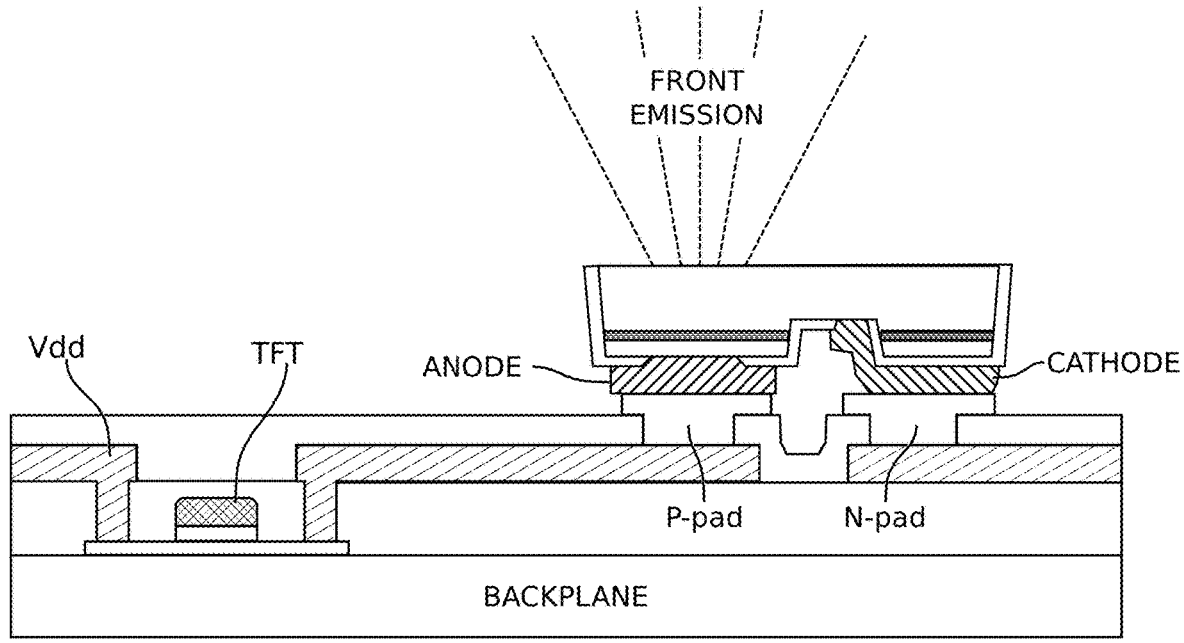
FIG. 1 is a partial cross-sectional view of a conventional front emitting microLED display (prior art).
Figure 2:
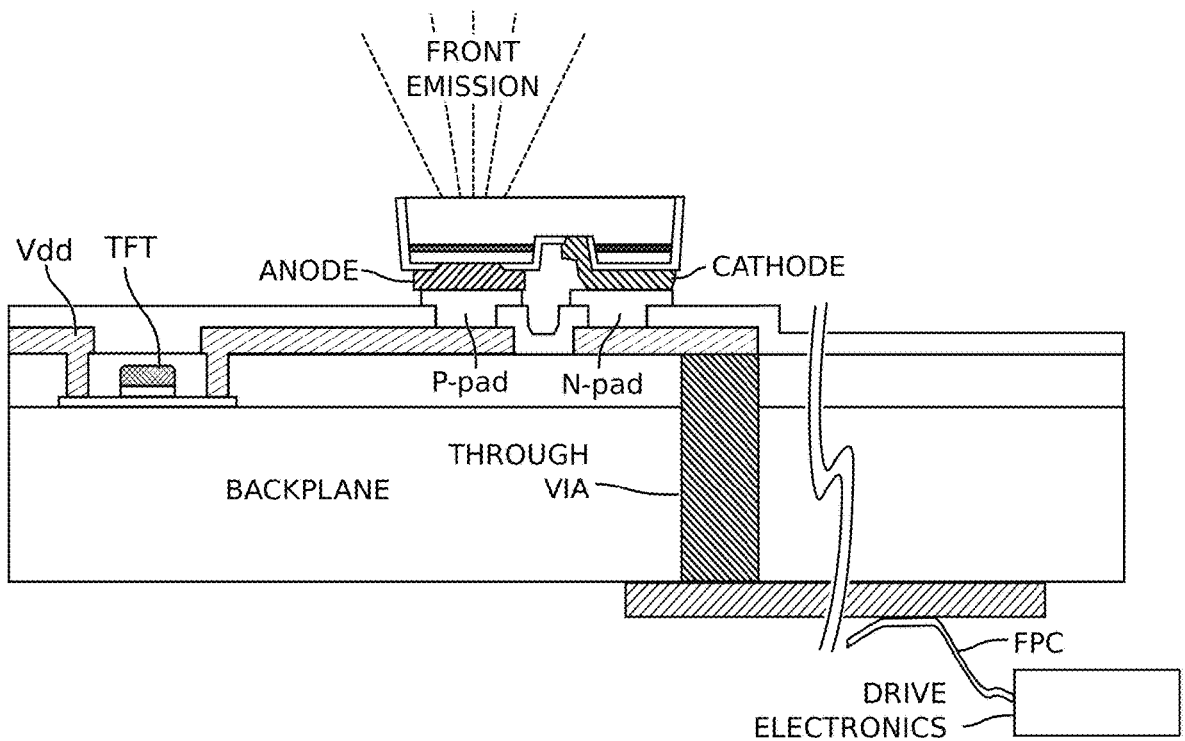
FIG. 2 is a partial cross-sectional view of a front emitting display with drive electronics accessed by a through hole via, bonded to a flexible printed circuit (FPC) (prior art).
Figure 3:
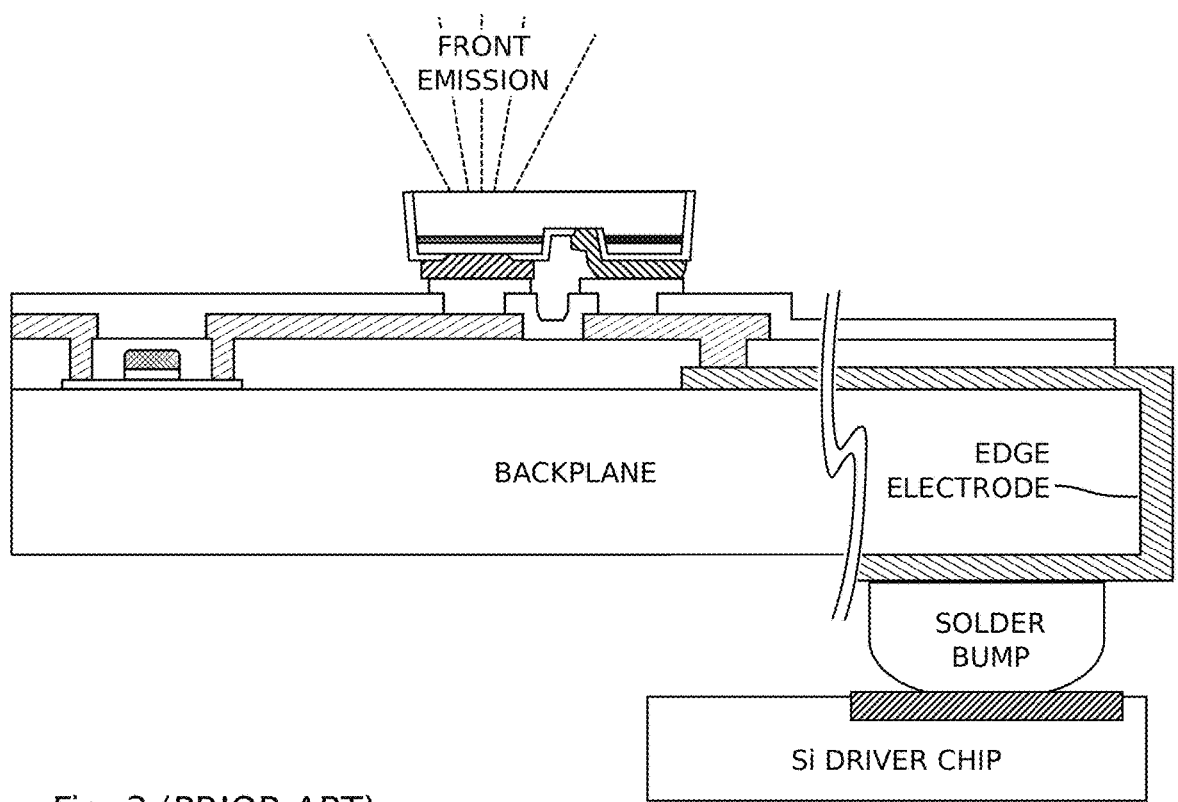
FIG. 3 is a partial cross-sectional view of a front emitting display with drive electronics accessed by edge wrap electrodes bonded to a silicon chip with solder bumps (prior art).

The general process for making a microLED display using inorganic LEDs and fluidic assembly on a display backplane has been reported in U.S. Pat. No. 9,825,202, entitled DISPLAY WITH SURFACE MOUNT EMISSIVE ELEMENTS and U.S. Pat. No. 10,418,527, entitled SYSTEM AND METHOD FOR THE FLUIDIC ASSEMBLY OF EMISSIVE DISPLAYS, incorporated herein by reference. The geometric requirements for fluidic assembly are presented in U.S. Pat. No. 9,825,202 starting at Col. 12, ln. 56, and shown in FIG. 16. In particular, the process flow for making a suitable display backplane is described starting at Col. 13, ln. 26, and shown in FIG. 17. The electrical requirements are described in Ser. No. 16/727,186, entitled SYSTEM AND METHOD FOR LIGHT EMITTING DIODE (LED) DISPLAY REPAIR, which is incorporated herein by reference. The display substrate described herein uses the same row and column arrangement of TFT control circuits as previously described, but the display architecture has been inverted so that the viewing surface is the back side of the transparent backplane.

FIGS. 5A through 5E are partial cross-sectional views of a back emission micro-light emitting diode (microLED). The microLED 500 comprises a first semiconductor layer 502 doped with either an n or p type dopant. The first doped semiconductor layer 502 has a first top surface 504 formed in a first plane 506 and a second top surface 508 formed in an overlying second plane 510, and a bottom emission surface 512. A multiple quantum well (MQW) layer 514 has a top surface 516 formed in a third plane 518 overlying the first doped semiconductor second top surface 508. A second semiconductor 520 is doped with the opposite dopant as the one used for the first semiconductor layer 502. The second semiconductor 520 is formed as a layer having a top surface 522 in a fourth plane 524, overlying the MQW layer 514. The first doped semiconductor 502 and second doped semiconductors 520 may be doped gallium nitride (GaN). Otherwise, the first doped semiconductor 502 and second doped semiconductor 520 may be doped gallium indium phosphide (GaInP) or doped gallium phosphide (GaP).

Figure 5A:
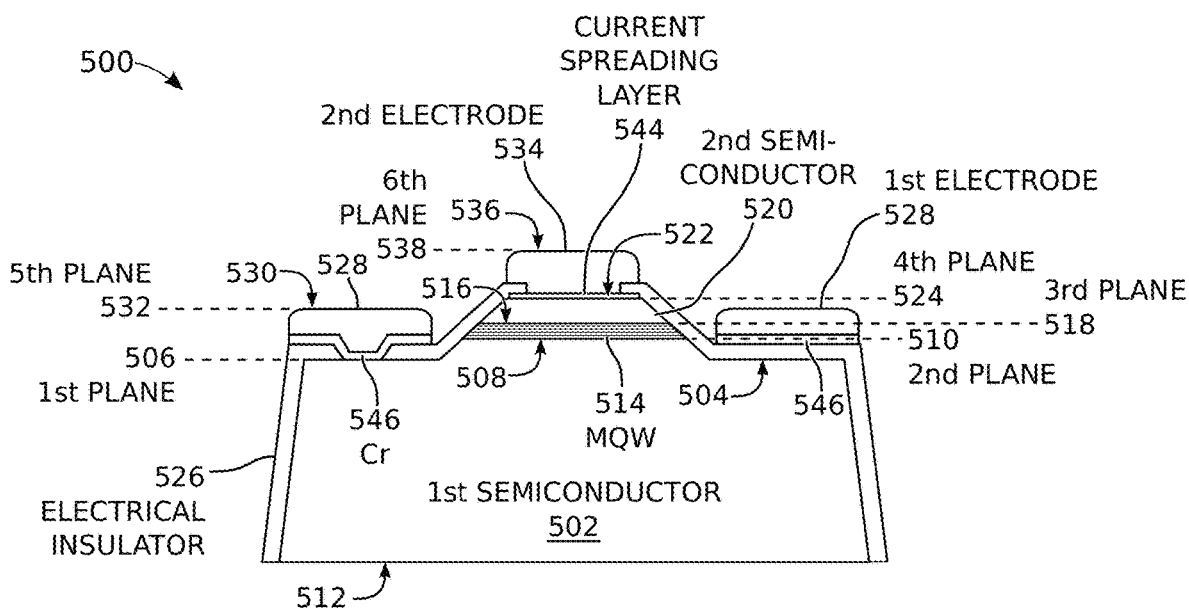
FIG. 5A through 5E are partial cross-sectional views of a back emission micro-light emitting diode (microLED).
Figure 5B:
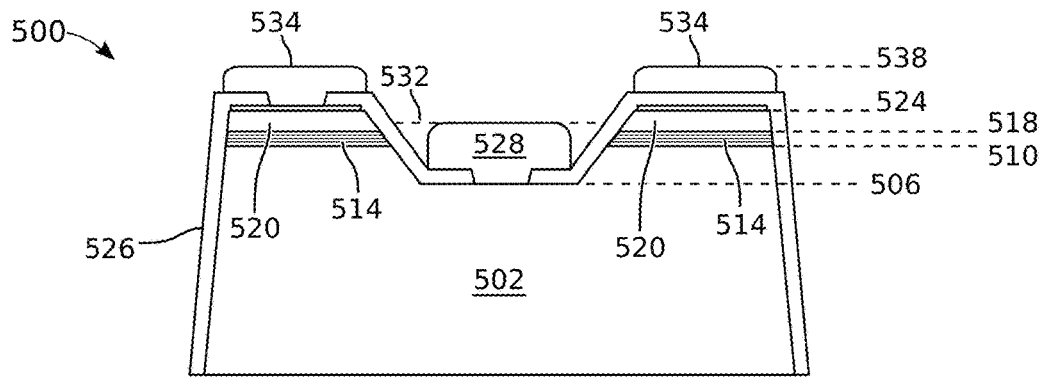
Figure 5C:
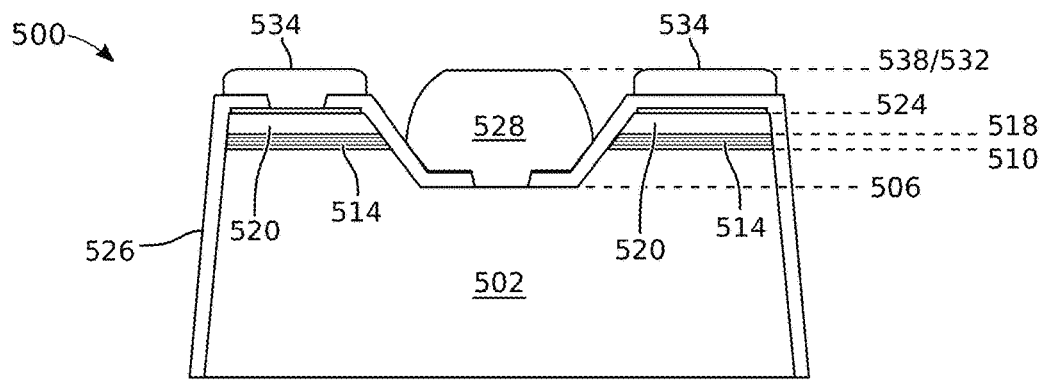
Figure 5D:
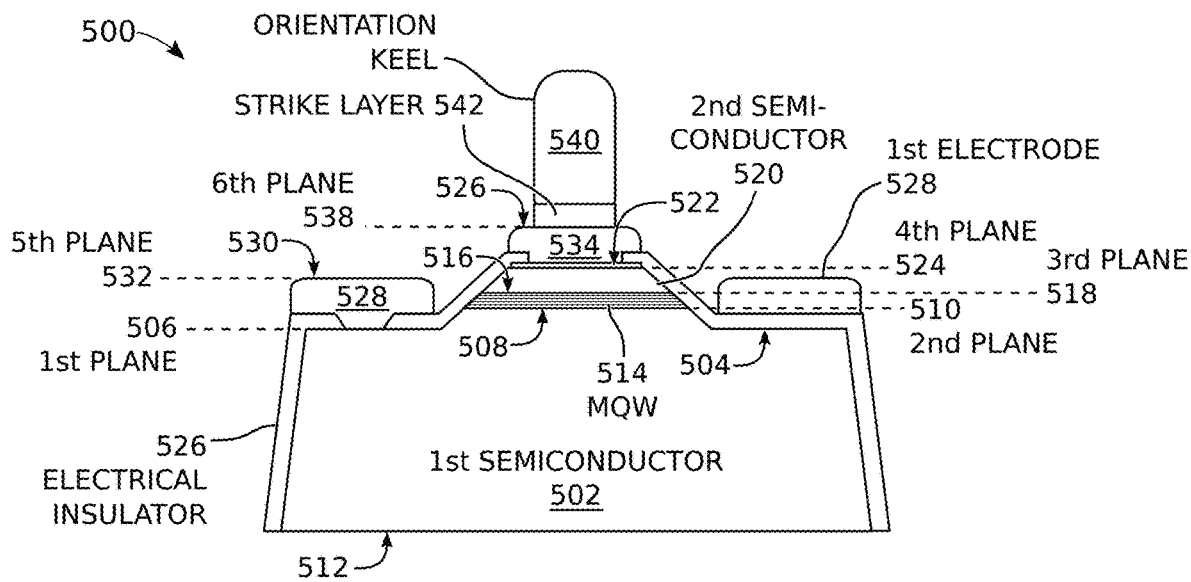
Figure 5E:
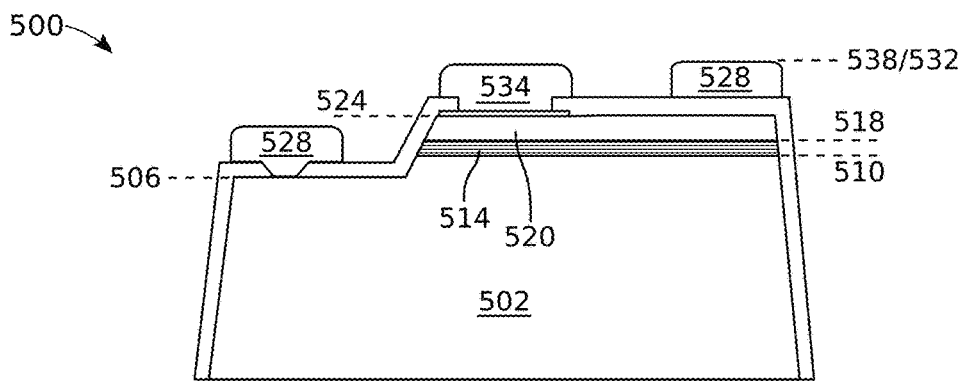

An electrical insulator 526 overlies the top surface 522 of the second doped semiconductor 520 and the first top surface 504 of the first doped semiconductor 502 and intervening sidewalls. The electrical insulator 526 may, for example, be aluminum oxide ($Al_2O_3$), silicon nitride ($Si_3N_4$), or silicon dioxide ($SiO_2$). One function of the insulator is to prevent leakage between the first and second doped semiconductors. A first electrode 528 overlies and is connected to the first doped semiconductor first top surface 504 through a first via. The first electrode 528 has a substrate interface surface 530 in at least a fifth plane 532. A second electrode 534 overlies and is connected to the second doped semiconductor 520 through a second via, and has a substrate interface surface 536 in a sixth plane 538. The first doped semiconductor second top surface 504 is in either a perimeter region, as shown in FIG. 5A, or the center of the first doped semiconductor layer as shown in FIG. 5B. Further, the fifth plane 532 may be coplanar with the sixth plane 538 (FIG. 5C), non-coplanar with the sixth plane as shown in FIGS. 5A, 5B and 5D, or include segments that are planar and segments that are non-coplanar with the sixth plane as shown in FIG. 5E. In the case of FIG. 5E the first semiconductor second top surface is formed in the center, as well as in a majority of the perimeter region. In one aspect, as shown in FIG. 5D, microLED 500 further comprises an electrically conductive orientation keel 540 overlying the center electrode, which in this case is the second electrode 534. Although not explicitly shown, an orientation keel can also be added to a first electrode when it is the center electrode, as would be possible with the microLEDs depicted in FIGS. 5B-5C and 5E. In one aspect (FIG. 5D), a titanium (Ti) strike layer 542 is interposed between the second electrode 534 and the orientation keel 540. In this example the orientation keel 540 may be copper (Cu).

Using FIG. 5A as an example, the microLED may include a current spreading layer 544 interposed between the second doped semiconductor 520 and the second electrode 534. Again using FIG. 5A as an example, if the first doped semiconductor 502 is n-doped GaN, the microLED may further comprise a chromium (Cr) metal layer 546 interposed between the n-doped GaN 502 and the first electrode 528. In this case, the first electrode 528 is a material such as a Cr/gold (Cr/Au) stack, a titanium/nickel (Ti/Ni) stack, or a Ti/Ti tungsten (Ti/TiW) stack.

Figure 6A:
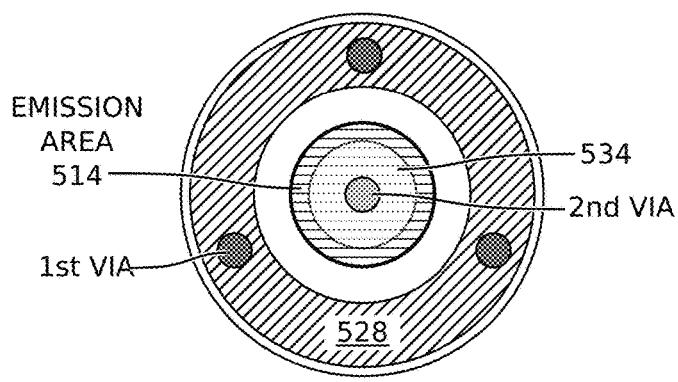
FIG. 6A through FIG. 6C are exemplary plan views of back emission microLEDs.
Figure 6B:
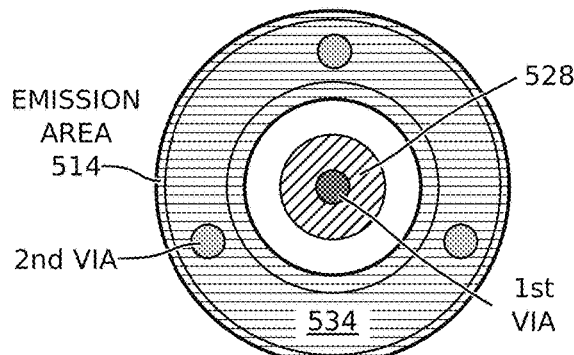
Figure 6C:
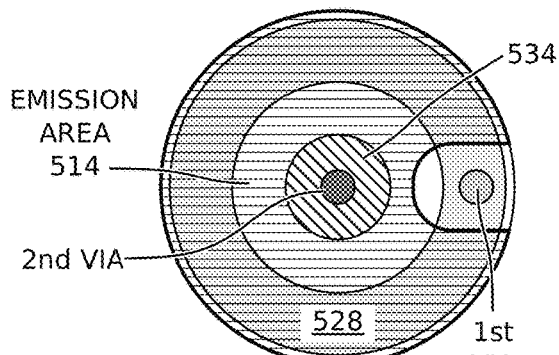

FIGS. 6A through 6C are exemplary plan views of back emission microLEDs. In FIG. 6A the first doped semiconductor first top surface is in a perimeter region of the first doped semiconductor layer. The first electrode 528 overlies the perimeter region and is connected to the first doped semiconductor (not shown) through a plurality of first vias (3 are shown in this example). The first electrode 528 has a substrate interface surface in the fifth plane. In FIG. 6B the first doped semiconductor second top surface is in a perimeter region of the first doped semiconductor layer, as shown in FIGS. 5B and 5C. In this case, the second electrode 534 overlies the perimeter region and is connected to the second doped semiconductor through a plurality of second vias (3 are shown in this example). The second electrode 534 has a substrate interface surface in the sixth plane. In FIG. 6C the first doped semiconductor second top surface is again in the center region and a majority of the perimeter, as shown in FIGS. 5E, and the first electrode is formed on both the fifth and sixth planes.

FIGS. 7A through 7G are partial cross-sectional views and top-down plan views depicting a back emission display backplane. The backplane 700 comprises a transparent substrate 702 with a top surface 704. A power interface layer 706 has a bottom surface 708 overlying the substrate top surface 704, a top surface 710 with a plurality of first electrical contacts 712 and a plurality of second electrical contacts 714, and a plurality of apertures 716 (shown as hatched lines) formed between a top surface 710 and the bottom surface 708. Second electrical contact 714 is connected to a row line 736, and first electrical contact 712 is connected to a column line (not shown). An emission layer 718 has a bottom surface 720 overlying the power interface layer top surface 710 and comprises a plurality of sub-pixel regions. For simplicity, only a single sub-pixel 722 is shown. Each sub-pixel region comprises a well 724 overlying a corresponding aperture 716, a first conductive via 726 electrically connected to a corresponding first electrical contact 712, and a second conductive via 728 electrically connected to a corresponding second electrical contact 714.

Figure 7F:
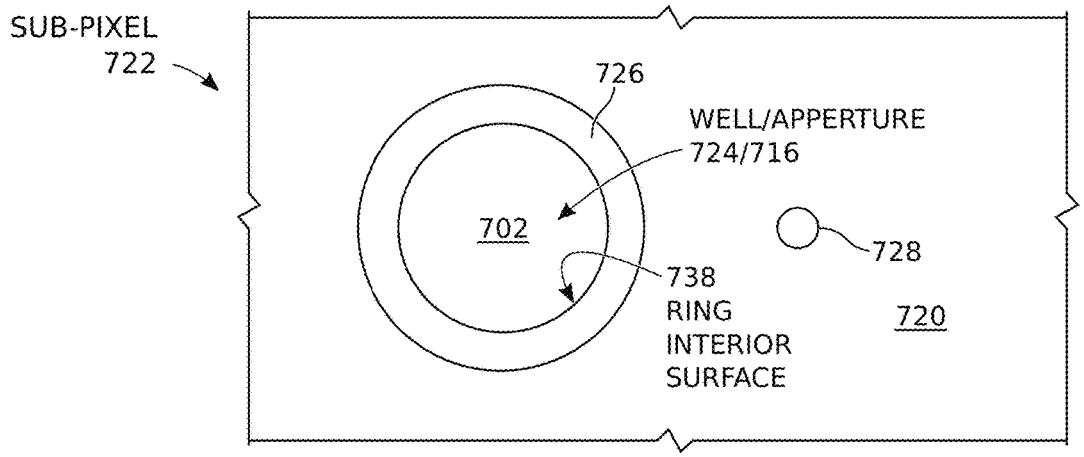
FIG. 7A through FIG. 7G are partial cross-sectional views and top-down plan views depicting a back emission display backplane.
Figure 7A:
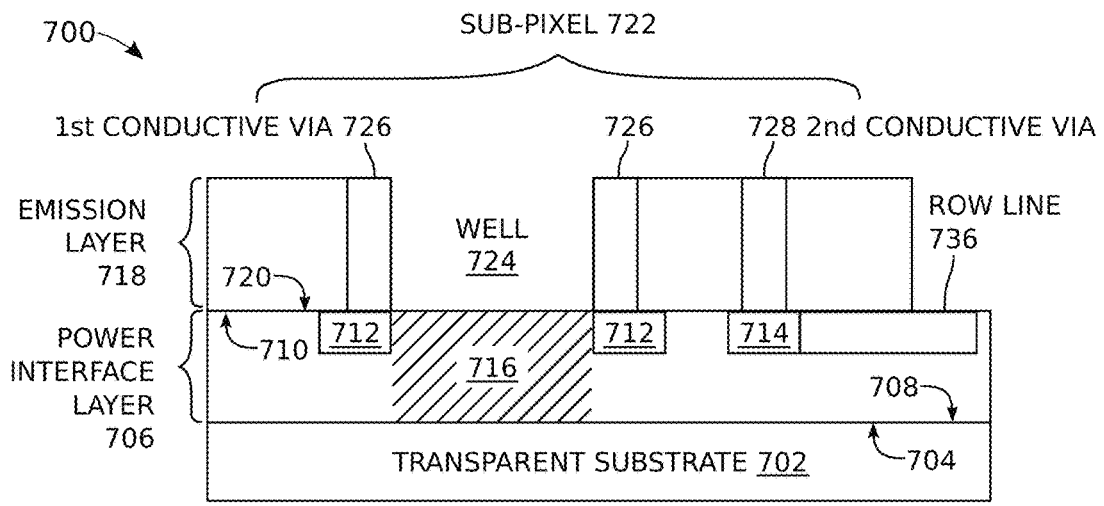
Figure 7B:
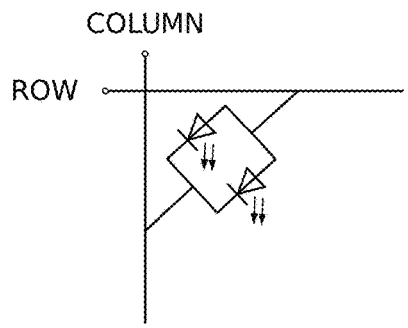

FIG. 7A depicts a passive matrix (PM) backplane and FIG. 7B represents two microLEDs associated with a single sub-pixel of a PM being enabled in response to signals (a voltage drop) between connected row and column lines.

Figure 7D:
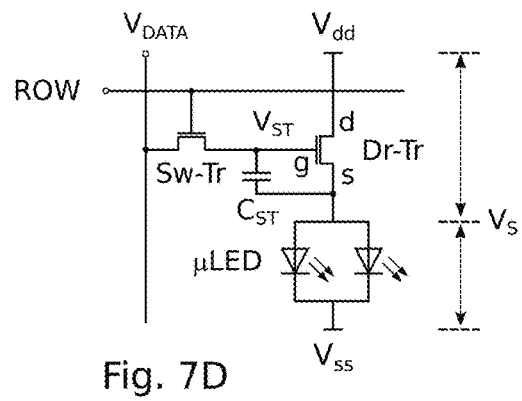
Figure 7C:
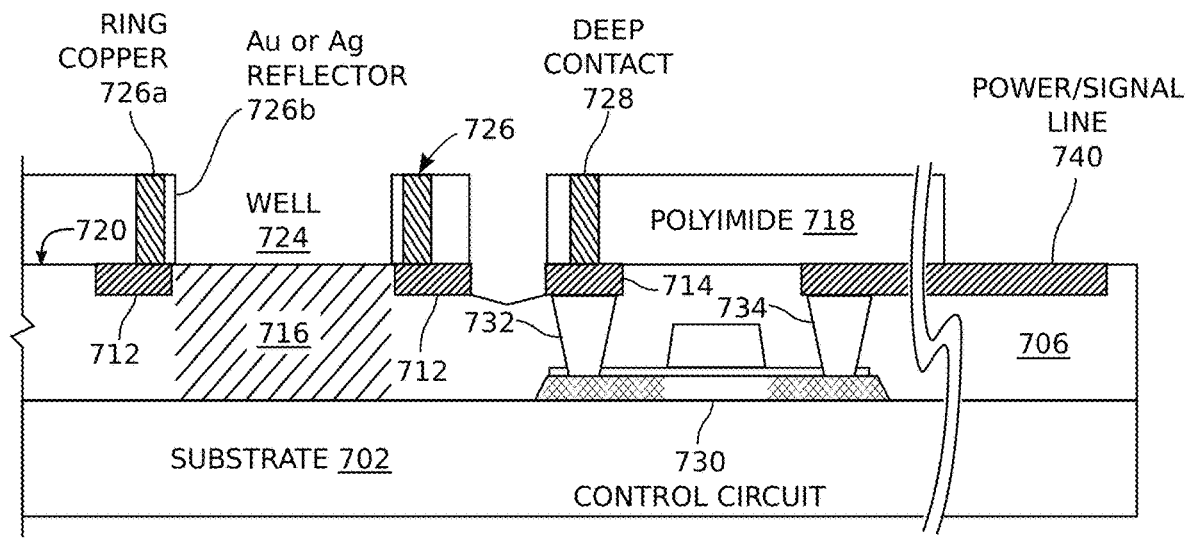

FIG. 7C depicts an active matrix (AM) backplane. In this case the power interface layer 706 further comprises a plurality of control circuits 730 (one per sub-pixel, as shown). For simplicity the control circuit 730 of FIG. 7C is represented as a single thin-film transistor (TFT). A typical control circuit may comprise at least two TFTs and as many as 6 or more TFTs. Each control circuit 730 has a first interface 732 electrically connected to a corresponding second electrical contact 728 through second electrical contact 714, and a second interface 734. An electrically conductive power signal line 740 is formed in the power interface layer top surface 710 and is electrically connected to control circuit second interface 734. Additional power control circuitry (not shown) may be formed on interfacing circuitry (e.g., the FPC) and connected to control circuit 730 through the power signal line 740. An electrically conductive column line (not shown) is formed in the power interface layer top surface and electrically connected to first electrical contact 726 through first electrical contact 712. In a manner similar to the connection to the power signal line, the column line may receive electrical signals from interfacing circuitry (e.g., the FPC) that control the ability of the microLED to turn on and off.

Figure 7E:
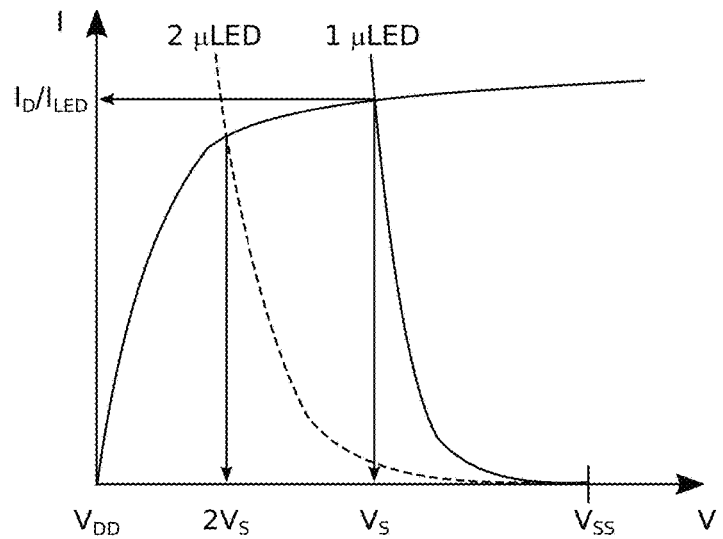

FIGS. 7D and 7E depict a typical microLED control circuit and associated current/voltage (IV) characteristics of the drive circuit and microLED. MicroLED displays are self-emitting devices and constant current is supplied to the LED to create the emission of light. The image data is supplied as a voltage via the power signal line, which is applied to the gate of the driving transistor (Dr-Tr) through the switching transistor (Sw-Tr). The data voltage ($V_{st}$) is stored in the storage capacitor ($C_{st}$), which holds the gate-to-source voltage ($V_{gs}$) of Dr-Tr at a constant value, which in turn controls the conductance of Dr-Tr and thus the current through the microLED.

The supply voltage $V_{DD}$ (on the power signal line) drops across the transistor and diode connected in series, and the percentage which drops across each device depends on their respective IV characteristics. MicroLED1 and microLED2 may have different IV characteristics as shown in FIG. 7E, where microLED1 has a lower turn on voltage. So the voltage across microLED1 ($V_{S1}$) is lower than that of microLED2 ($V_{S2}$) for the sub-pixel control circuit of FIG. 7D. The power consumption of the transistors and microLED at the light-on condition is $I_D \times (V_{DD} - V_S)$ and $I_{LED} \times V_S$, respectively, where $I_D$ and $I_{LED}$ are equal. MicroLED pixel circuits continue to consume power after the switching transistor is turned off. The power is used to produce light from the microLED, but the drive transistor also dissipates a significant portion of total power.

As can be seen in the plan view of FIG. 7F, each first conductive via 726 in the emissive layer 720 may be formed as a ring overlying a corresponding second electrical contact (not shown). In one aspect, the first conductive via ring 726 has an optically reflective interior surface 738. As shown for example in FIG. 7B, the first conductive via ring 726 may be a copper (Cu) outer surface 726a with a silver (Ag) interior surface 726b.

Figure 7G:
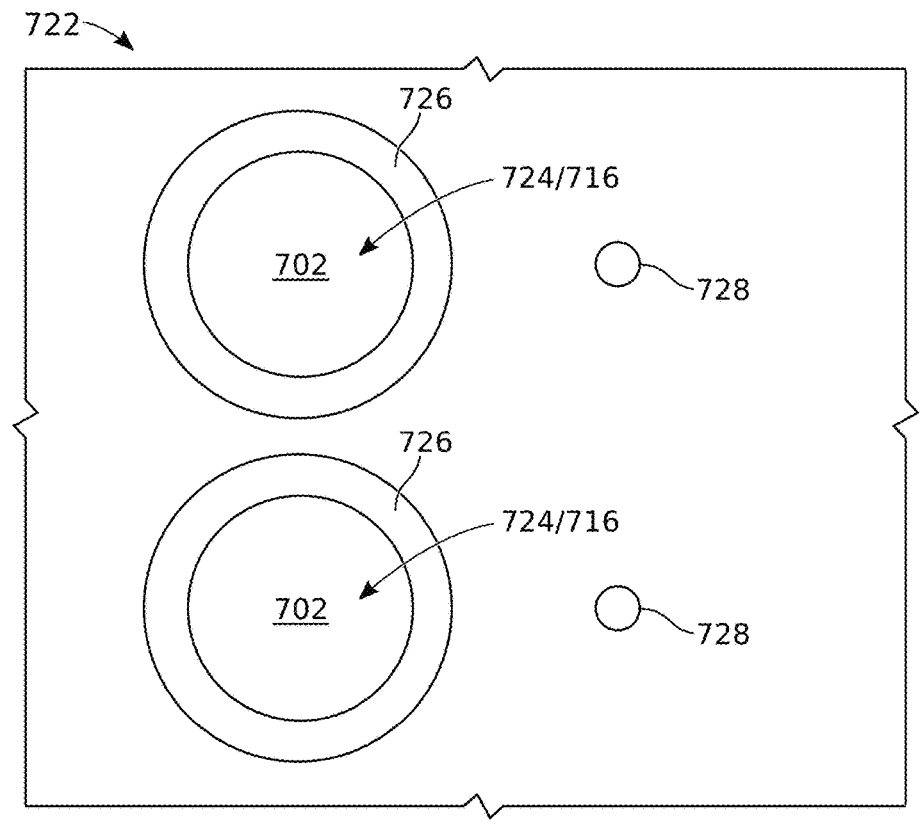

As shown in FIG. 7G, each sub-pixel region 722 may comprise a plurality of wells 724 overlying corresponding apertures 716. Two wells are shown in this example. As shown in FIGS. 7A and 7C, for each well, a first conductive via is electrically connected to a corresponding first electrical contact, and a second conductive via is electrically connected to corresponding second electrical contact.

Figure 8A:
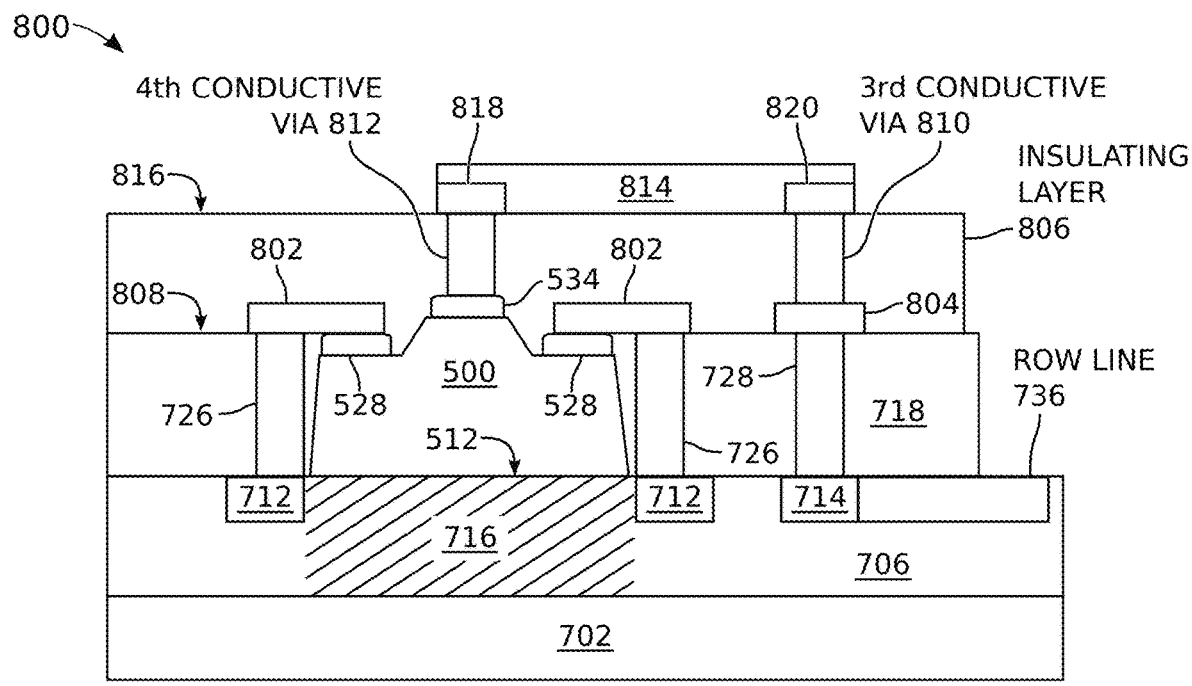
FIG. 8A and FIG.
Figure 8B:
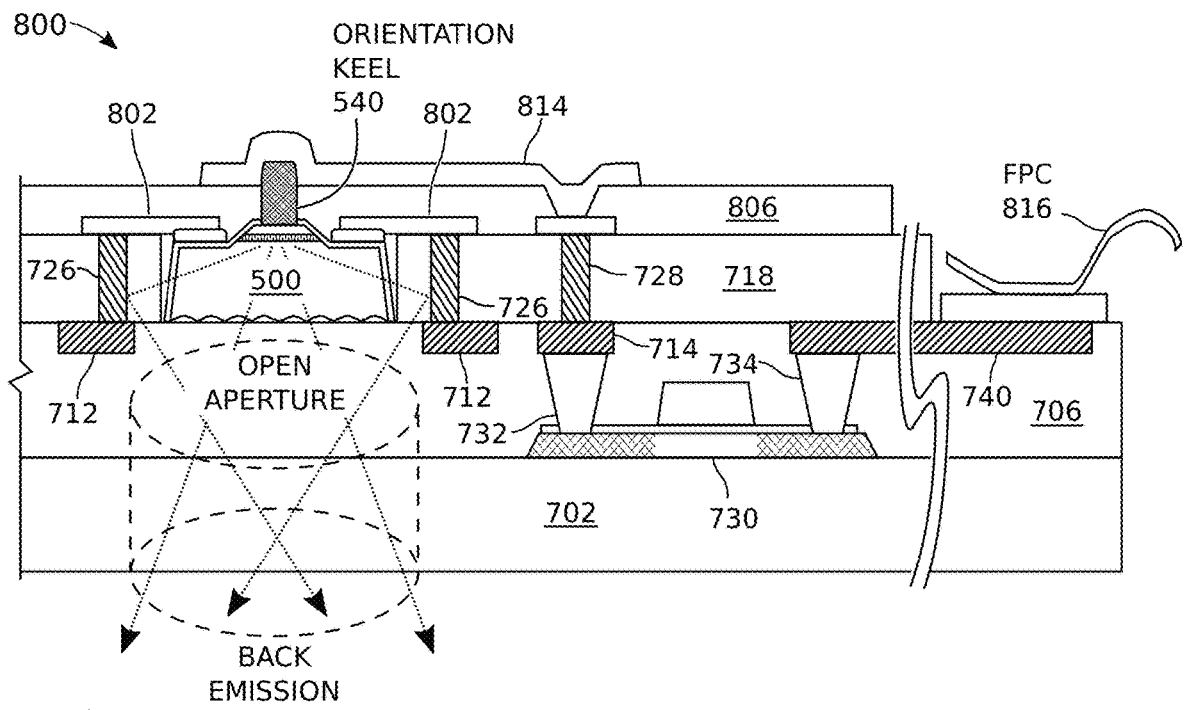
FIG. 8B are partial cross-sectional views of, respectively, passive and active matrix back emission displays.

FIGS. 8A and 8B are partial cross-sectional views of, respectively, passive and active matrix back emission displays. The displays 800 are fabricated using the backplanes described above. As described above, the display 800 includes a transparent substrate 702 with a top surface 704. A power interface layer 706 has a bottom surface 708 overlying the substrate top surface 704, a top surface 710 with a plurality of first electrical contacts 712 and a plurality of second electrical contacts 714, and a plurality of apertures 716 (shown as hatched lines) formed between a top surface 710 and the bottom surface 708. An emission layer 718 has a bottom surface 720 overlying the power interface layer top surface 710 and comprises a plurality of sub-pixel regions. For simplicity, only a single sub-pixel is shown. Each sub-pixel region comprises a well 724 overlying a corresponding aperture 716, a first conductive via 726 electrically connected to a corresponding first electrical contact 712, and a second conductive via 728 electrically connected to a corresponding second electrical contact 714.

A back emission micro-light emitting diode 500 occupies each well 724, having an emissive bottom surface 512 overlying a corresponding aperture 716, a first electrode 528 formed on the microLED top surface, and a second electrode 534 formed on the microLED top surface. As an example, the microLED of FIG. 5A is shown, but the display is not limited to any particular variation of the back emission microLEDs described above. A first electrical interconnect 802 is formed on the emission layer top surface, electrically connecting each first conductive via 726 to a corresponding microLED first electrode 528. Also shown is a conductive pad 804 overlying and electrically connected to second conductive via 728. An insulating layer 806 overlies the emission layer top surface 808, comprising a third conductive via 810 electrically connected to a corresponding second conductive via 728 on the emission layer top surface and a fourth conductive via 812 electrically connected to a corresponding microLED second electrode 534. A second electrical interconnect 814 is formed on the insulating layer top surface 816 electrically connecting the third conductive via 810 to the fourth conductive via 812 through electrically conductive pads 818 and 820.

As shown in FIG. 8B, the power interface layer 706 may comprise a plurality of control circuits 730 (one per sub-pixel, as shown). For simplicity the control circuit 730 is depicted as a single TFT. Each control circuit 730 has a first interface 732 electrically connected to a corresponding second electrical contact 728 through second electrical contact 714, and a second interface 734. An electrically conductive power signal line 740 is formed in the power interface layer top surface 710 and electrically connected to control circuit second interface 734. An electrically conductive column line (not shown) is formed in the power interface layer top surface and electrically connected to first electrical contact 726 through first electrical contact 712. A connection to the power signal line 740 is made through a flexible printed circuit (FPC) 816, but alternatively the connection may be a solder bump to a driver chip.

Optionally, as shown in FIG. 8B, the microLED 500 further comprises an electrically conductive orientation keel 540 electrically connected to the second electrode 534, which acts as the fourth conductive via shown in FIG. 8A. Although not shown, the microLED of FIG. 8A may also include an orientation keel in place of the fourth conductive via. It can also be seen in FIG. 8B that the third conductive via is formed by the second electrical interconnect 814.

As shown in FIG. 7F, each first conductive via 726 in the emissive layer 718 may be formed as a ring surrounding the well and overlying a corresponding first electrical contact 712. The first conductive via ring 726 may likewise have an optically reflective interior surface. Further, although not explicitly shown in FIGS. 8A or 8B, each sub-pixel region comprises a plurality of wells, with corresponding apertures, first conductive vias, and second conductive vias as shown in FIG. 7G.

As noted above, the transparent substrate is fabricated with a display control interface with each sub-pixel consisting of two or more thin-film transistors. A microLED may be captured in a trap structure (well) surrounded by a metal reflector ring and centered over an open aperture in the backplane circuitry that directs the emitted light toward the viewer. P-pad and n-pad connections to the backplane are formed after fluidic assembly and the external power and control signals are connected by, for example, an FPC. Other methods of interfacing the backplane to external power and control electronics are possible including solder bumps, anisotropic conductive film (ACF), adhesive, pogo pins and the like, all of which connect electrically with the open bond pads, whether they be column, power signal, or row lines.

The microLED fabrication process is similar to the process flow disclosed in U.S. Pat. No. 10,804,426, incorporated herein by reference, with changes to the n-pad contact to accommodate the new display architecture. In addition, the requirement that n-pad and p-pad electrode surfaces be in the same plane is not necessarily required for the back emitting structure.

Figure 9A:
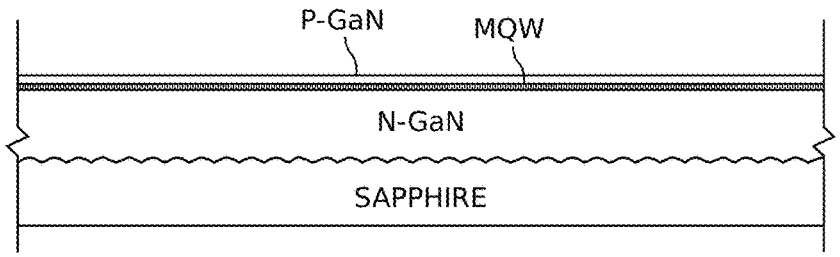
FIG. 9A through FIG. 9N and FIG. 9P through FIG. 9R are partial cross-sectional and plan views of exemplary process flows to fabricate a GaN based back emission microLED.

FIG. 9A through FIG. 9N and FIG. 9P through FIG. 9R are partial cross-sectional and plan views of exemplary process flows to fabricate a GaN based back emission microLED. In a first process, an LED stack is deposited on a sapphire wafer by metalorganic chemical vapor deposition (MOCVD) as described in U.S. Pat. No. 10,804,426 (FIG. 9A). Other substrates such as silicon carbide (SiC) or silicon can be used but sapphire substrates allow the microLEDs to be removed from the growth substrate by laser lift off (LLO). Optionally, the sapphire surface can be textured to improve light extraction (i.e., a patterned sapphire substrate (PSS)) as shown in the figure. The MQW structure is tuned to produce the desired emission wavelength and the resulting LED structure is typically between 2 and 7 microns (μm) thick. A current spreading layer (not shown) may be deposited on the p-GaN surface. The current spreading layer is typically a thin (10 nm or less) nickel oxide ($NiO_x$) interface layer plus a transparent conductive oxide such as indium tin oxide (ITO), which may be 100 to 500 nm thick.

Figure 9B:
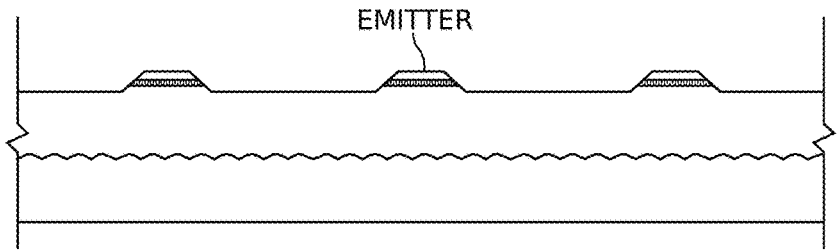
Figure 9C:
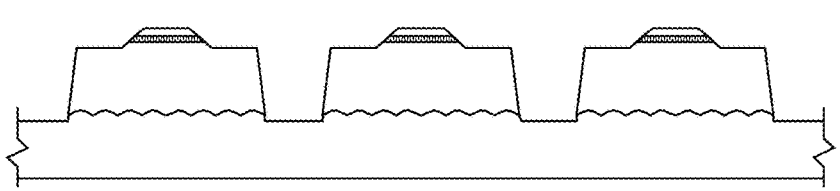
Figure 9C:
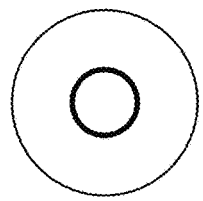
Figure 9D:
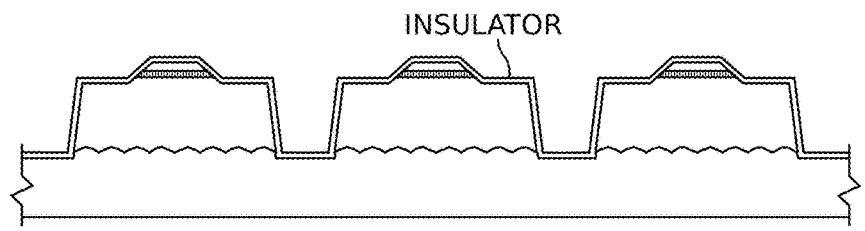
Figure 9D:
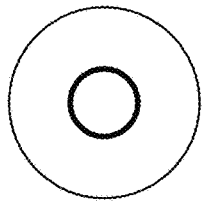

In FIG. 9B the emission area is defined by photolithography and the MOCVD stack is etched to a depth (first plane) extending into the n-doped GaN layer. Details of the emitter shape options are described in U.S. Pat. No. 10,804,426, while the figure shows the center emitter case. In FIG. 9C the microLED area is defined by photolithography and the full stack is etched down to the sapphire substrate. The resulting microLED diameter is typically 18 to 150 μm. In FIG. 9D an insulating layer, typically plasma-enhanced chemical vapor deposition (PECVD) silicon dioxide ($SiO_2$) or atomic layer deposition (ALD) aluminum oxide ($Al_2O_3$), 100 to 400 nm thick, is deposited to prevent current leakage across the device.

Figure 9E:
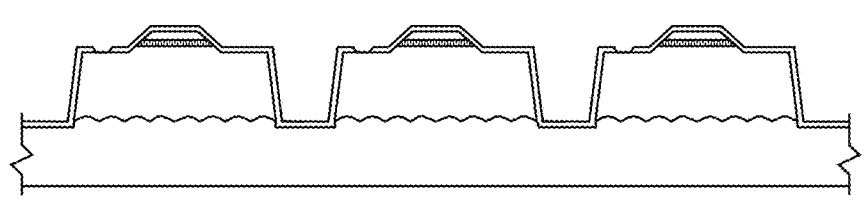
Figure 9E:
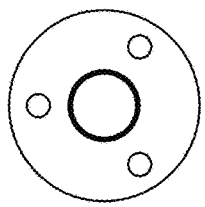
Figure 9F:
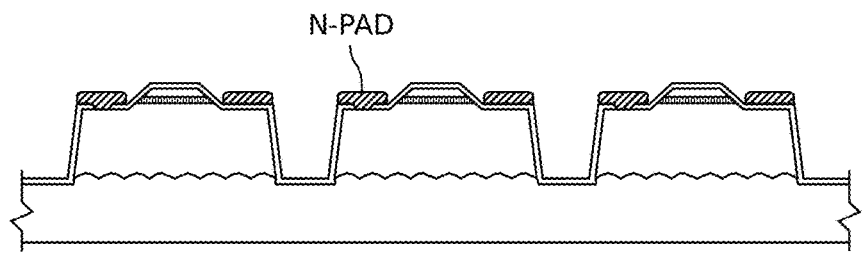
Figure 9F:
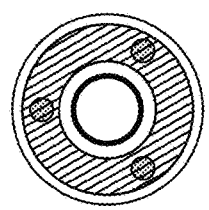

In FIG. 9E contacts are opened in the insulating layer to the n-GaN regions. In FIG. 9F a lithographic pattern is formed to prevent metal deposition outside the N-pad electrode areas (shown as a ring shape) and the metal stack is deposited connected to the microLED contact openings. The first metal layer is chosen for adhesion to the isolation oxide and a work function match with n-doped GaN. The typical material is chromium (Cr) from 10 to 50 nm thick. The electrode metals may be Cr/Au, Ti/Ni or Ti/TiW with a total thickness of 100-200 nanometers (nm). The excess metal is removed by a lift off process.

Figure 9G:
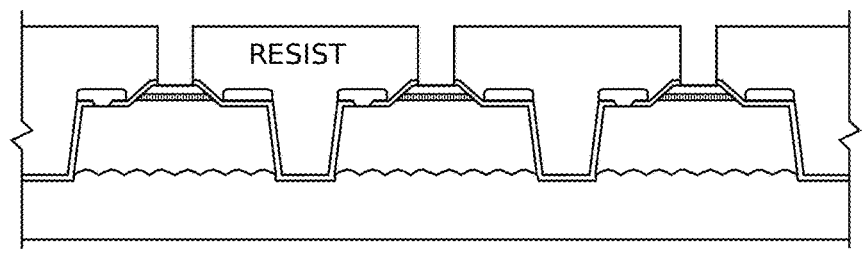
Figure 9G:
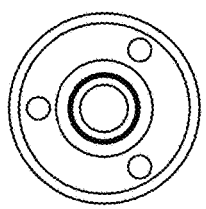
Figure 9H:
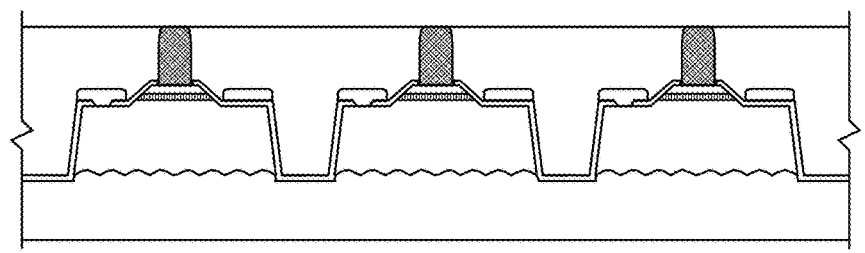
Figure 9H:
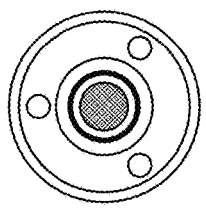

In FIG. 9G a resist material is patterned with openings centered on the emitter area and the insulating layer is etched to open a contact to the ITO electrode connected to the p-pad over the emitter. In FIG. 9H post electrodes (orientation keels) are formed typically by depositing a thin strike layer such as titanium then electroplating copper to fill the cylindrical forms in the resist layer. Alternatively, the post can be formed by electroless plating. The post can serve both as an electrical connection and the orientation keel for fluidic assembly, so the height and diameter of the post are chosen based on the principles enumerated in U.S. Pat. No. 9,892,944 (incorporated herein by reference) and U.S. Pat. No. 10,804,426. Typically, the post is 2 to 15 μm in diameter and 6 to 12 μm tall in proportion to the microLED diameter. Optionally, the surface can be polished by chemical mechanical polishing (CMP) after plating to improve uniformity of post tops.

Figure 9I:
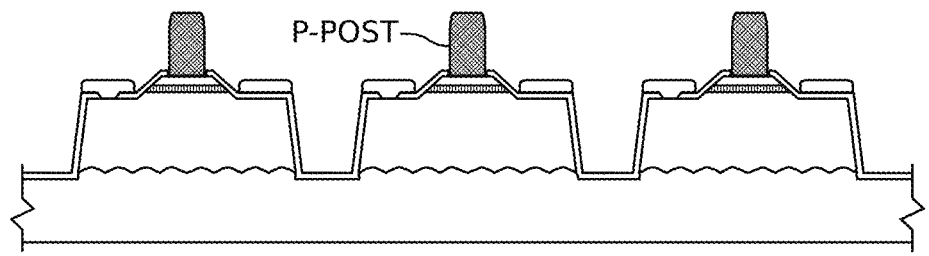
Figure 9J:
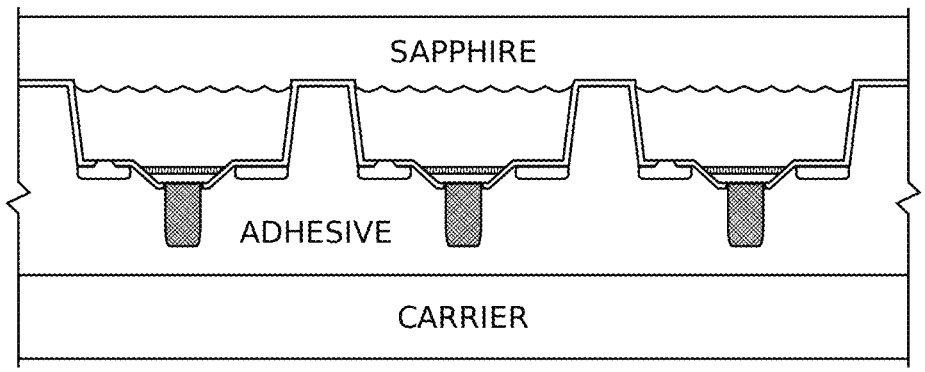
Figure 9K:
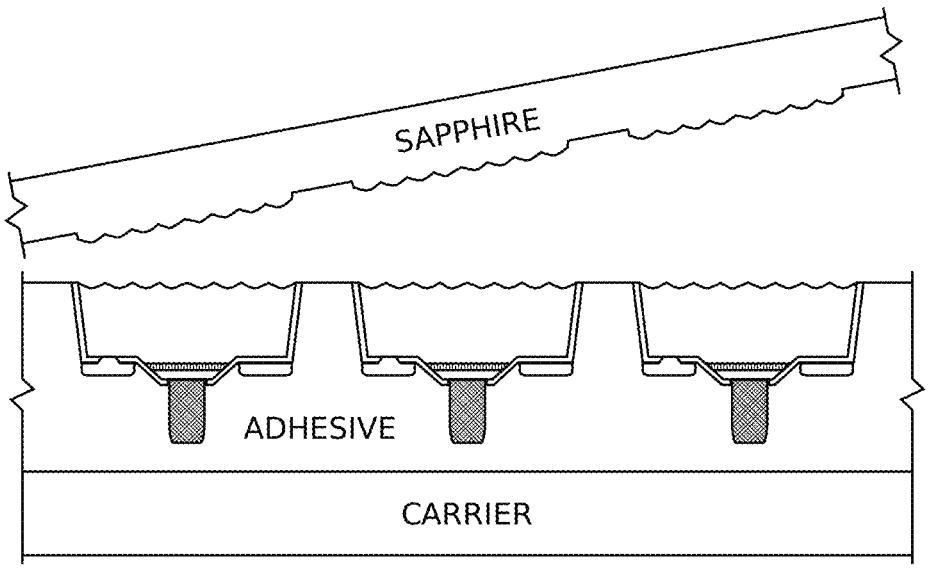
Figure 9L:
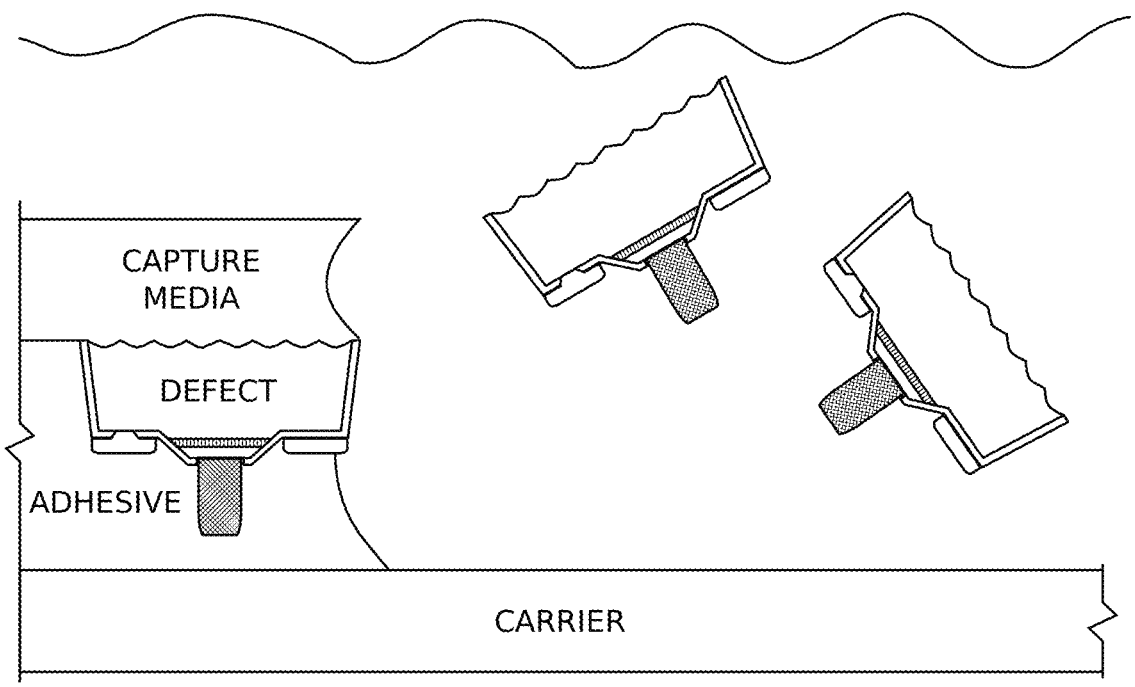

In FIG. 9I the strike layer is etched and the resist is removed, leaving the completed microLEDs attached to the substrate. In FIG. 9J the completed wafer top side is bonded to a temporary carrier with an adhesive layer and the sapphire growth wafer is removed by LLO. Now the microLEDs are oriented n-GaN up on the carrier wafer in a planar array embedded in adhesive as shown in FIG. 9K. Optionally, the n-GaN may be etched to reduce the thickness of the microLED. The inspection and capture methods described in U.S. Ser. No 16/875,994, entitled SYSTEM AND METHOD FOR THE SELECTIVE HARVEST OF EMISSIVE ELEMENTS (incorporated herein by reference), are used to identify and eliminate defective microLEDs. The known good microLEDs are harvested into a suspension by dissolving the adhesive using a suitable solvent as shown in FIG. 9L. Although not explicitly shown, the above-described process can be modified to yield any of the microLED variations depicted in FIGS. 5A-5E, as would be known by a person with ordinary skill in the art.

Figure 9M:
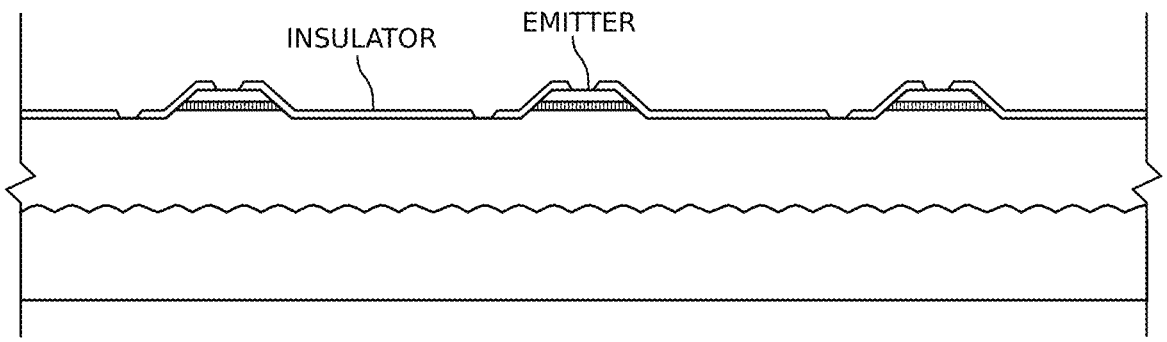
Figure 9N:
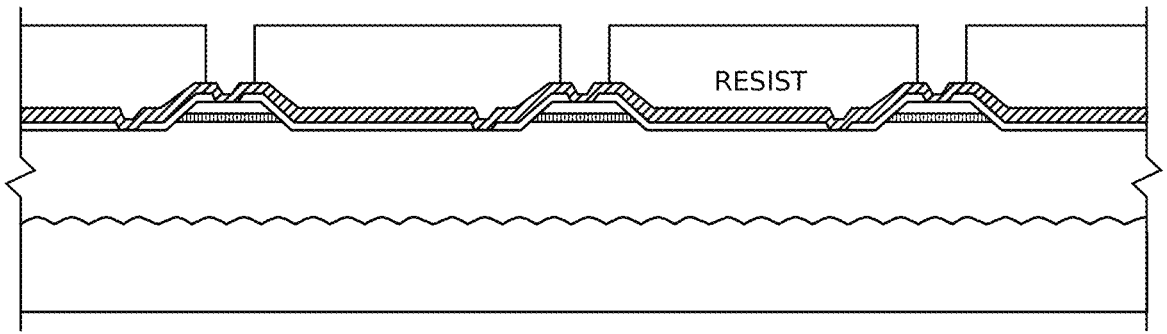
Figure 9P:
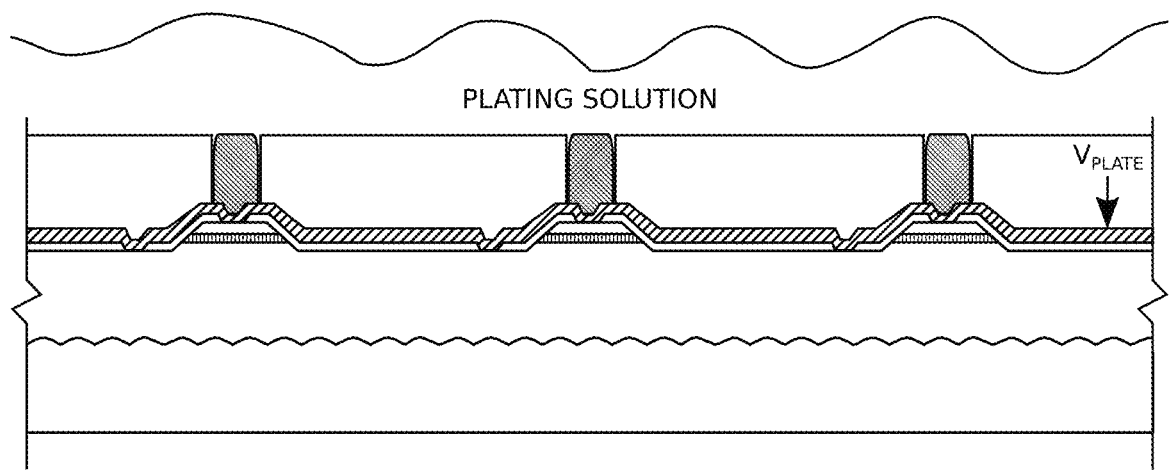
Figure 9Q:
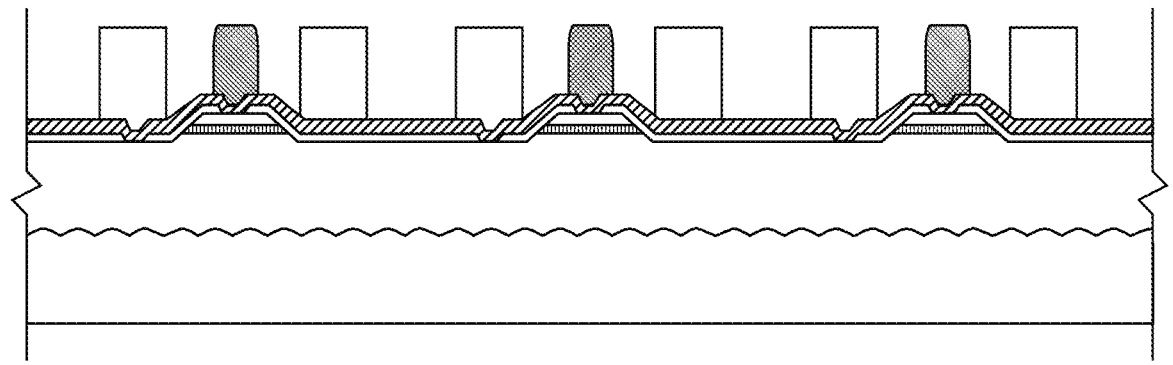
Figure 9R:
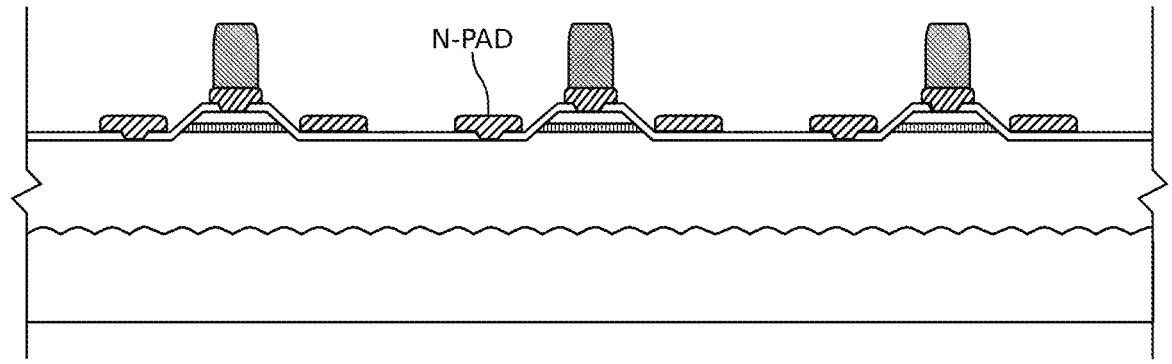

In a second process, the electrical insulator overlying the MOCVD stack is etched to reveal the first and second semiconductors, FIG. 9M. A strike layer is conformally deposited, and a photoresist layer is deposited and patterned to expose the second electrode (FIG. 9N). A plating solution is applied to form the orientation keel, FIG. 9P. The first photoresist layer is removed and a second photoresist layer is patterned to cover the first semiconductor contact, as shown in FIG. 9Q, and in FIG. 9R the first electrode is formed. Although not explicitly shown, the above-described process can be modified to yield any of the microLED variations depicted in FIGS. 5A-5E, as would be known by a person with ordinary skill in the art.

Figure 10A:
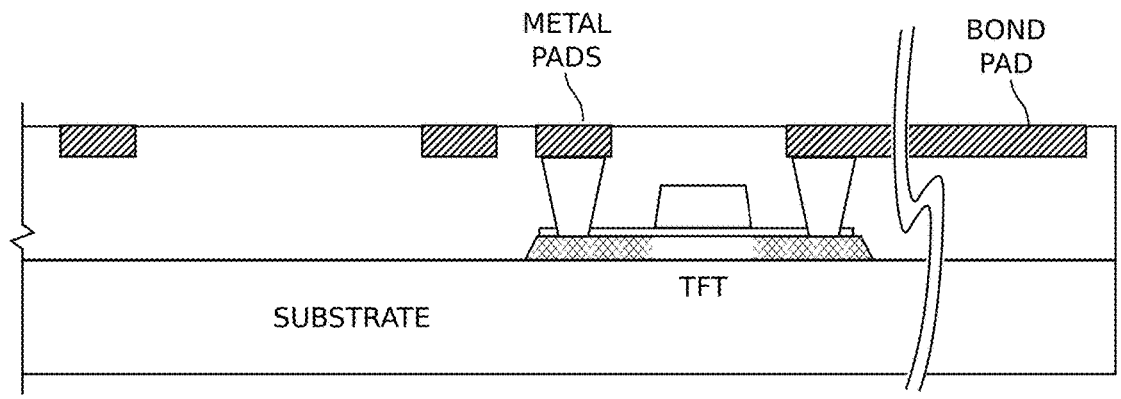
FIG. 10A through FIG. 10C are partial cross-sectional views depicting steps in the fabrication of a back emission backplane sub-pixel.
Figure 10B:
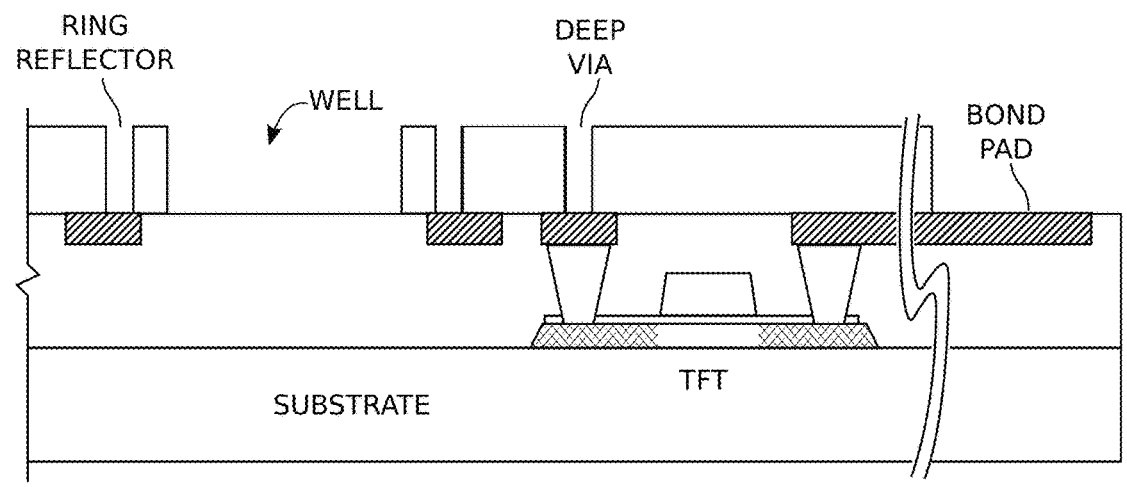
Figure 10C:
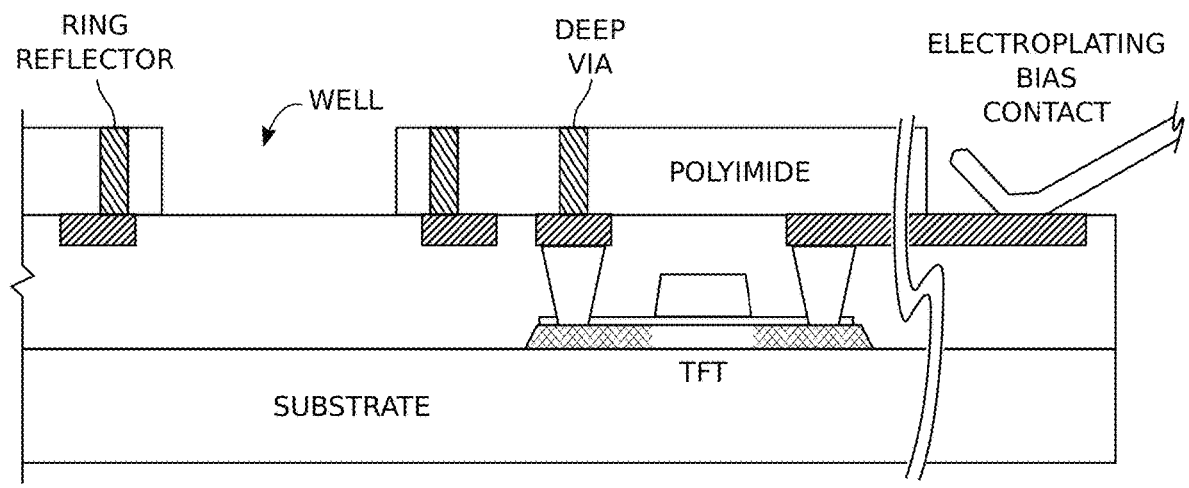

FIGS. 10A through 10C are partial cross-sectional views depicting steps in the fabrication of a back emission backplane sub-pixel. Fabrication for the back emission display is substantially different than for the front emitting fluidic assembly display. An AM backplane starts with the formation of TFTs using either Low Temperature Poly Silicon (LTPS) or Indium Gallium Zinc Oxide (IGZO) transistors. The minimum sub-pixel circuit has two TFTs and a more complex circuit with more transistors may be used to improve performance. As shown in FIG. 10A, the TFTs are connected to bond pads and metal interconnects that may be aluminum, copper, titanium-tungsten, chromium, or other low resistance metals. The top surface of the metal stack is a strike layer such as titanium or chromium chosen for compatibility with the following electroplating process. In FIG. 10B a thick layer of photo patternable polyimide or a siloxane-based material is patterned with openings that provide trap structures for fluidic assembly as well as a ring reflector surrounding the well and a via opening for connection to the TFT circuit. FIG. 10C shows the completed backplane after electroplating copper in the openings with strike electrodes connected to the electroplating bias voltage. To facilitate the plating process, the bias electrodes are connected together so after plating it is necessary to open windows in the polyimide (or siloxane) layer and etch the interconnections between electrodes. The etch windows must be smaller than the diameter of the fluidic assembly wells to prevent capture of microLEDs.

Figure 11A:
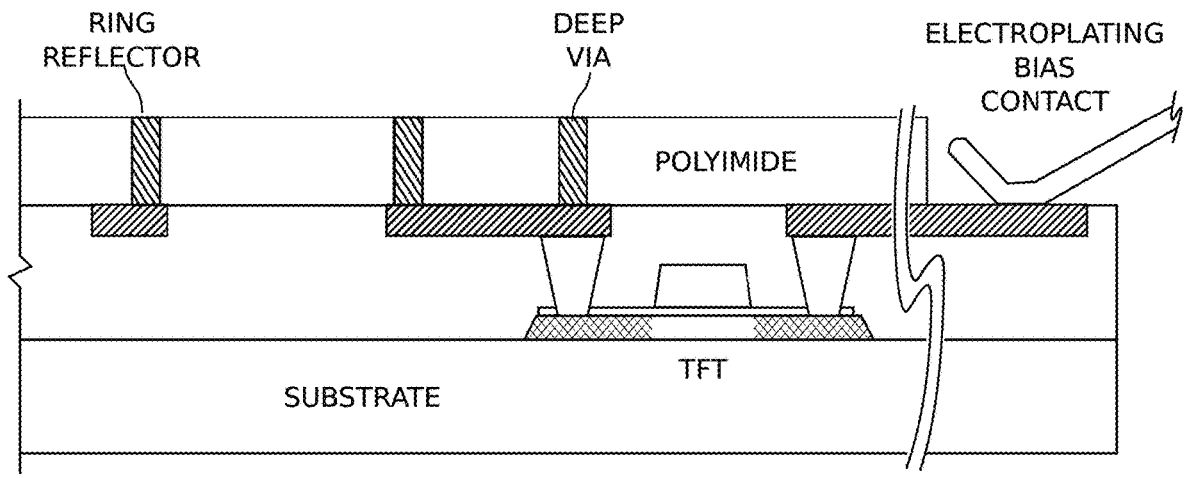
FIG. 11A through FIG. 11E are partial cross-sectional views depicting an alternative backplane process flow.
Figure 11B:
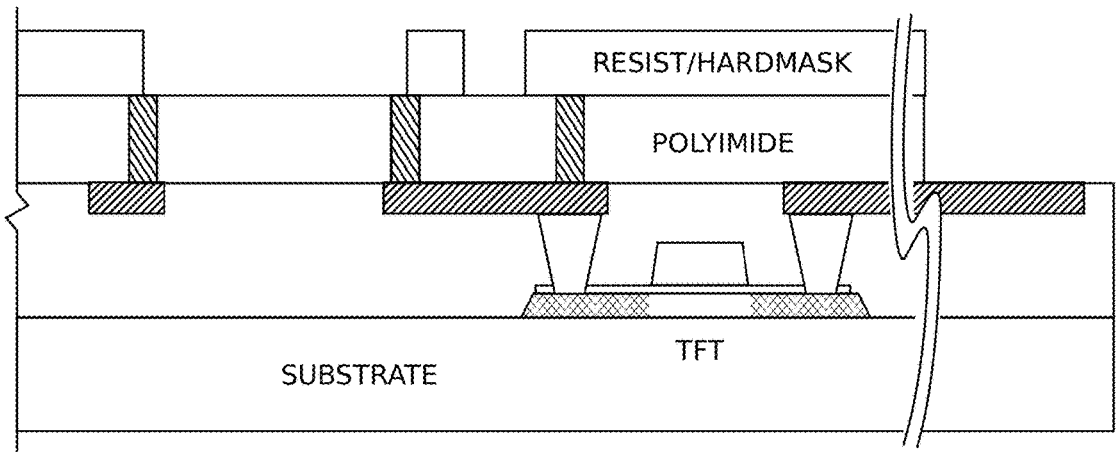
Figure 11C:
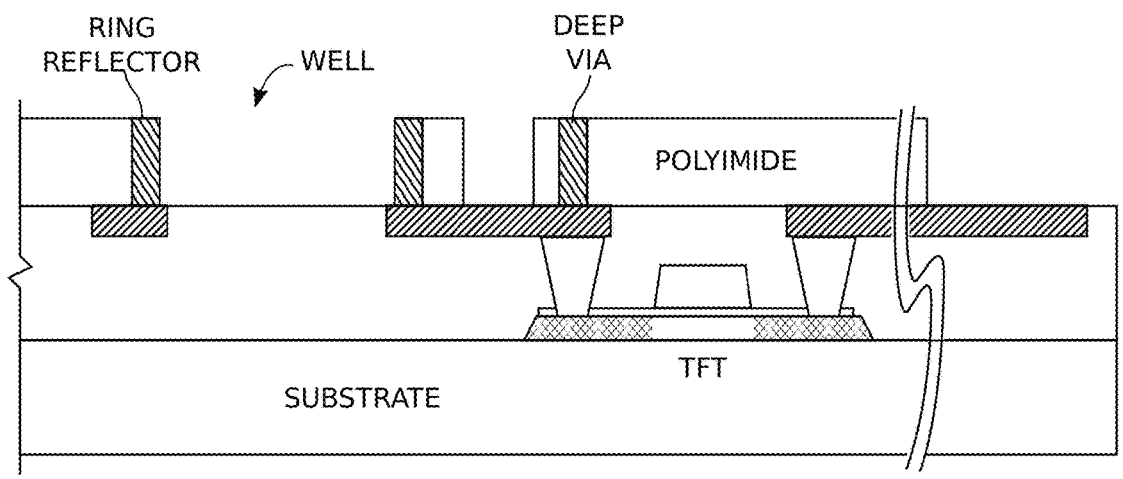
Figure 11D:
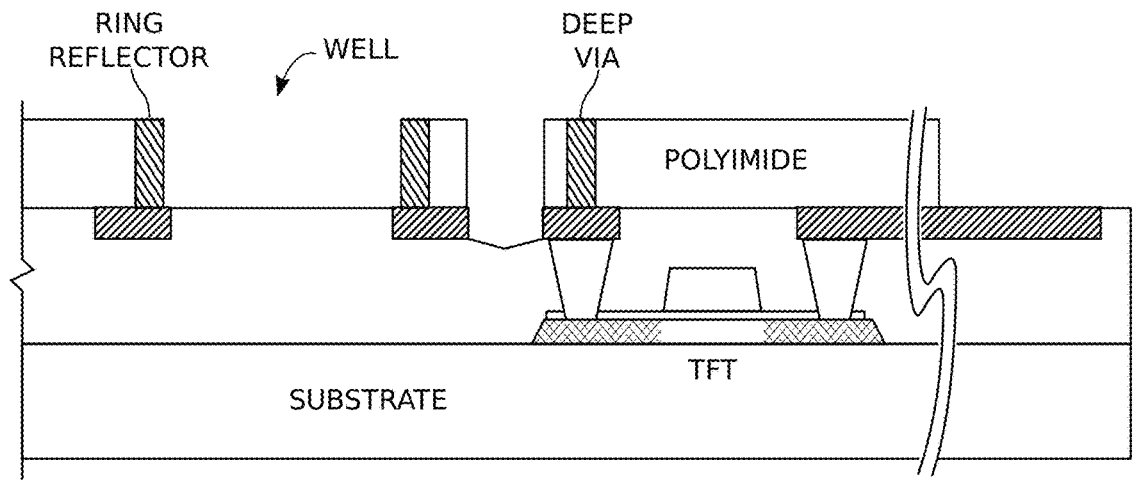
Figure 11E:
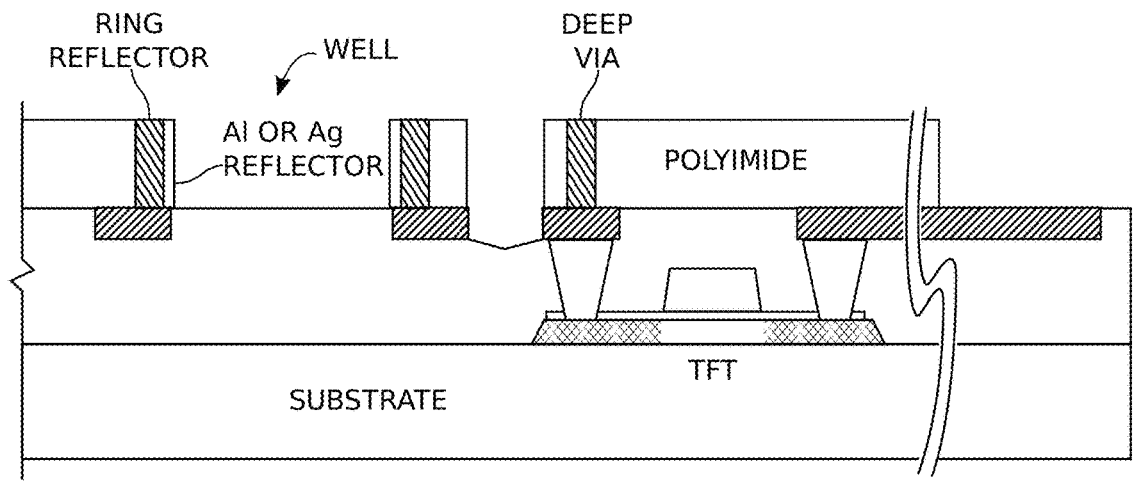

FIGS. 11A through 11E are partial cross-sectional views depicting an alternative backplane process flow. The reflective ring also forms the vertical wall of the well structure used for fluidic assembly. In FIG. 11A, the structures are electroplated and in FIG. 11B, a photoresist pattern is formed to etch openings in the polyimide (or siloxane) layer for the well and to etch the connections between electrodes. Optionally, the patterning layer can consist of the photoresist layer plus a hard-mask layer that is more resistant to etching. In FIG. 11C, the polyimide layer is etched, stopping on the well base layer, and the electrode to be etched. In FIG. 11D the connection between electrodes is etched to isolate the deep contact from the ring reflector. In this process an electrode structure such as titanium or Ti/Al can be chosen, which can be etched selectively without damaging the copper structures.

Copper is chosen for the reflector structure because electroplating of high aspect ratio features is a well-developed technology. Copper is not an ideal reflector for light in the visible spectrum however, with reflectance of only about 50% at 450 nm. It may be very desirable to improve the reflectance of the ring structure by plating a thin layer of aluminum or silver over the copper ring structure, which would improve reflectance to over 90% at 450 nm. After the well structure is opened in FIG. 11C, either aluminum electroplating or electroless silver deposition can be carried out to produce the structure shown in FIG. 11E.

Figure 12:
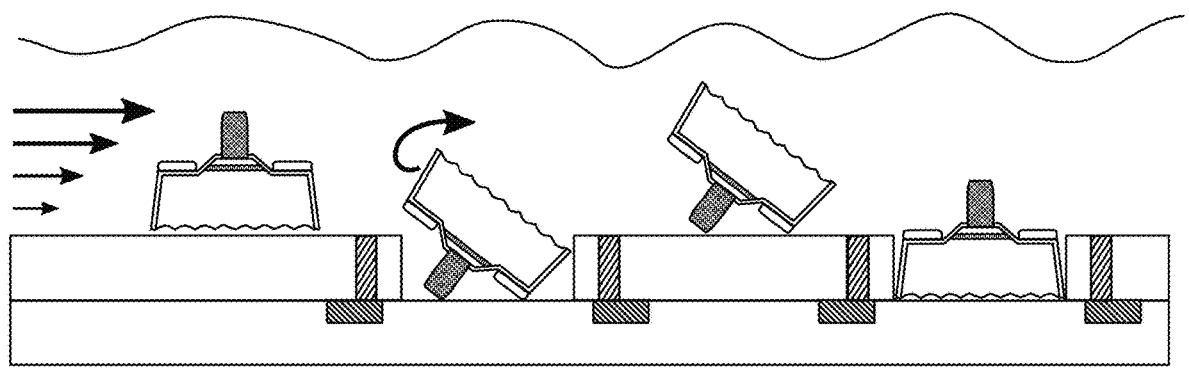
FIG. 12 is a partial cross-sectional view summarizing the microLED fluidic assembly process.

FIG. 12 is a partial cross-sectional view summarizing the microLED fluidic assembly process. Fluidic assembly proceeds in the normal fashion by applying a liquid suspension of microLEDs with orientation keels to the backplane of FIG. 11E and forcing flow over the surface so microLEDs are reoriented with orientation keels (posts) up and assembled in wells. After assembly is complete and verified by optical inspection, any excess microLEDs are removed from the surface and recycled by a cleaning process. The remaining assembly fluid is removed.

After assembly is complete, the display fabrication process continues by forming metal lines to connect microLEDs to the control circuits. Metallization is conventionally formed by sputter or evaporation of copper, aluminum, titanium/tungsten or the like. Patterning of the metal can be by lithography and etching, or by lithography and lift-off. These processes are well known in the display industry and need not be described in detail to one skilled in the art.

Figure 13A:
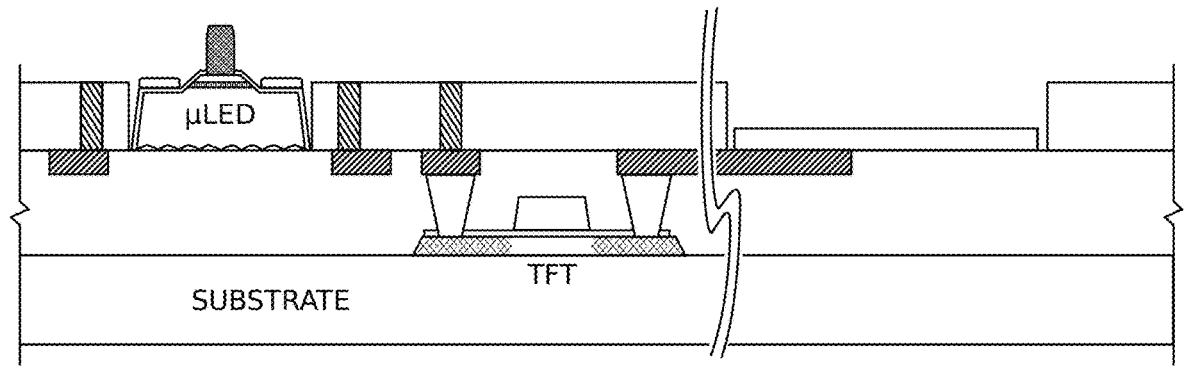
FIG. 13A through FIG. 13F are partial cross-sectional views briefly depicting the back emission display fabrication process.
Figure 13B:
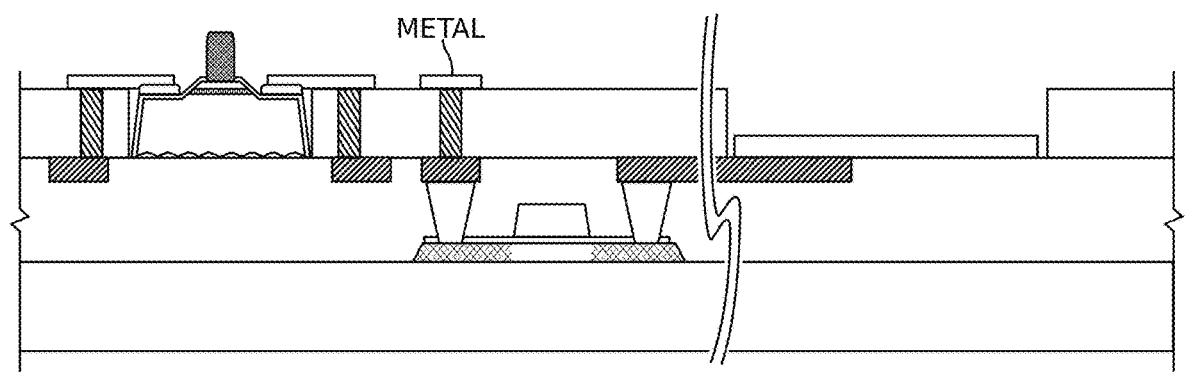
Figure 13C:
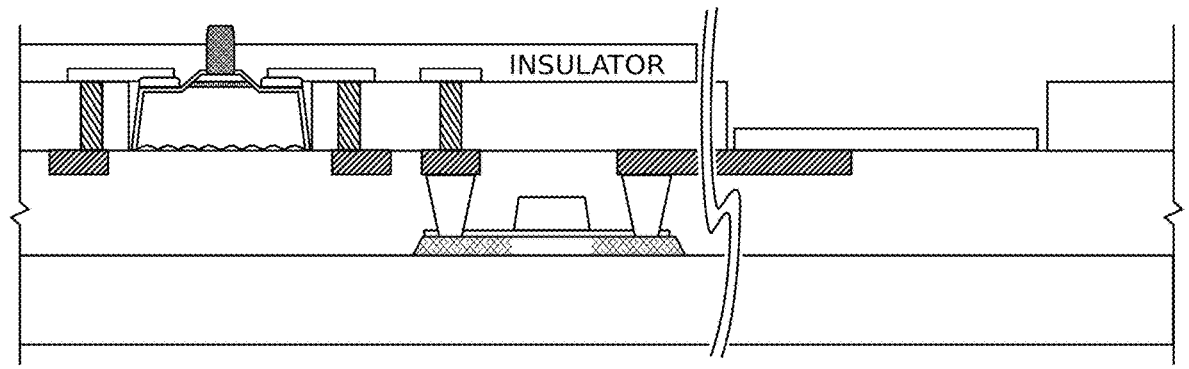
Figure 13D:
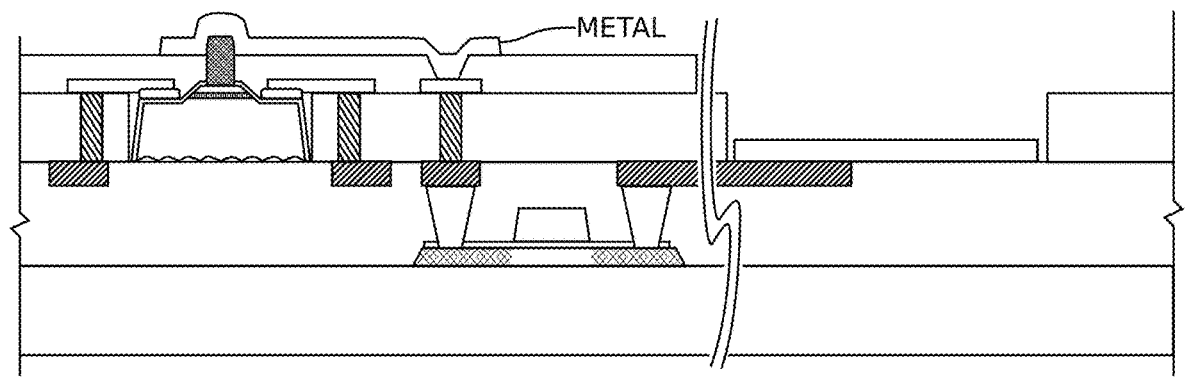
Figure 13E:
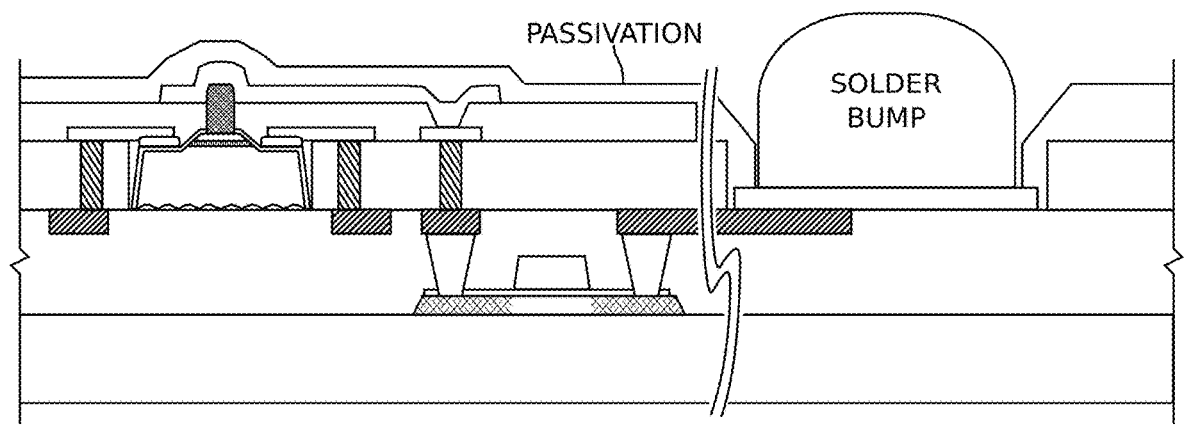
Figure 13F:
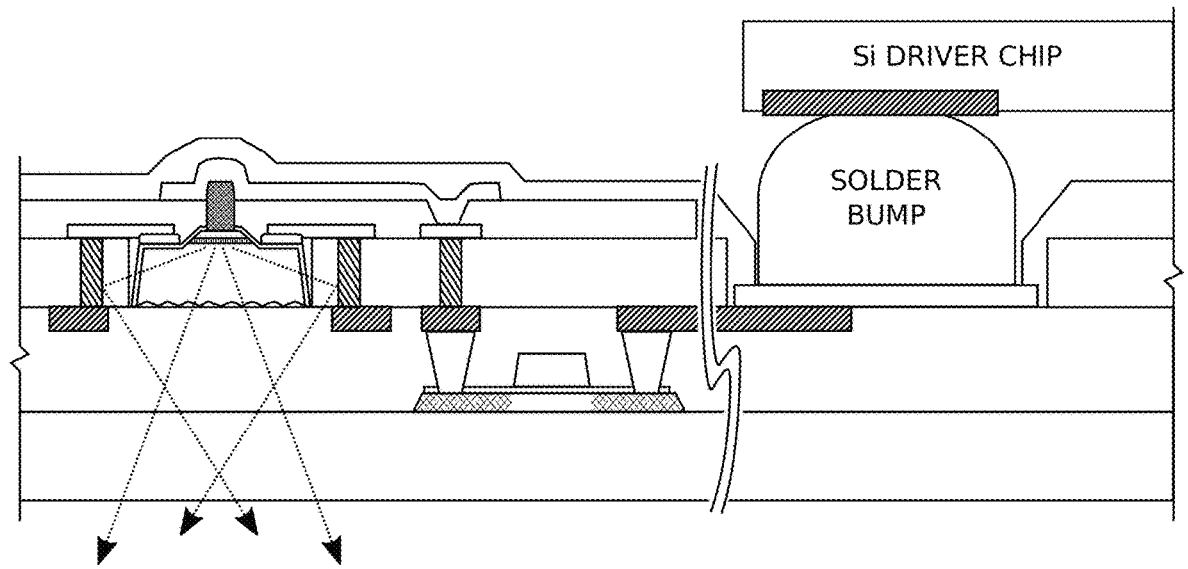

FIGS. 13A through 13F are partial cross-sectional views briefly depicting the back emission display fabrication process. In FIG. 13A the backplane is shown after fluidic assembly with a microLED in position for connection, and an opening in the well layer for a bonding pad. In FIG. 13B the n-pad electrode of the microLED is connected to the reflector ring with the first level of interconnect. In FIG. 13C an insulating material is spin coated to provide isolation between the first and second levels of metallization. In FIG. 13D contacts are opened to connect with the first level pads and an optional descum (plasma) etch can be used to ensure that the self-aligned post (orientation keel) on the p-pad of the microLED is exposed for connection. If the microLEDs are fabricated without orientation keels, they may be deposited using a pick-and-place or mass transfer methodology. In FIG. 13E the second level metal is deposited and patterned connecting the p-pad of the microLED to the control interface. The completed circuitry is protected by a passivation layer and optionally solder bumps are formed on the bond pads. If connections to external electronics are made by other means such as FPC or ACF, then the solder bump is not used. In FIG. 13F the display is completed by FPC or ACF connection or by bonding a silicon driver chip to the solder bumps as shown. Although the microLED of FIG. 5D is shown, the fabrication process may be enabled with any of the microLEDs shown in FIGS. 5A-5E, as would be known in the art.

Figure 14:
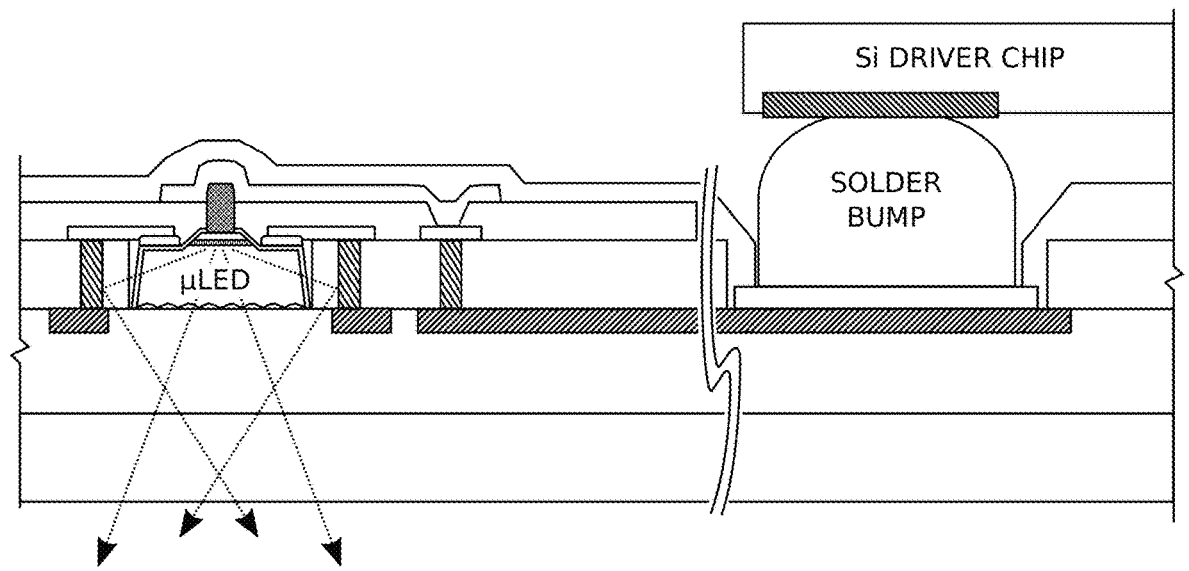
FIG. 14 is a partial cross-sectional view of a back emission display using a passive matrix backplane.

FIG. 14 is a partial cross-sectional view of a back emission display using a passive matrix backplane. It should be noted that the back emitting pixel architecture can be used with many different display configurations. In particular, a tiled display need not be an active matrix using TFTs on the backplane. TFTs are low quality devices with low power-handling ability compared to those fabricated in single crystal silicon. Therefore, the possibility of bonding a silicon driver chip directly to the display suggests making a passive matrix display with direct silicon drivers to eliminate the resistive loss in pixel drive TFTs as shown. Although the microLED of FIG. 5D is shown, the fabrication process may be enabled with any of the microLEDs shown in FIGS. 5A-5E, as would be known in the art.

The back emitting display architecture has several advantages over the prior art front emitting display. All fabrication is carried out on one surface of the backplane and electrical connections are on the back of the display so there is no interference with the display image and tiled displays can be made with zero bezel width. The reflective ring structure increases display efficiency by directing more of the light generated to the viewer. The well structure is completely flat on the bottom surface so there is no electrode topography to interfere with positioning of the microLED during fluidic assembly. Because contact is made to the microLED in a conventional fashion there is no need for complex solder structures on the microLED, and there is no need for microLED processing after laser liftoff. More than half of the cost of the microLED display is in the fabrication of the microLEDs.so simplification of the microLED process flow is of utmost importance. Further, there is no need to form the solder bond by heating the substrate, which can cause cracking and delamination especially on plastic substrates.

There are also aspects of the back emission architecture which are more complex than the front emission display. The interconnect processing is performed after fluidic assembly so any microLEDs not removed by cleaning may interfere with interconnect patterning, causing shorts or opens. Plating required for the conductive post (orientation keel) on the microLED and for the ring reflector structures is a more complex operation compared to the deposition of metals by sputtering or evaporation. Electroplating requires a bias supplied to the strike electrode in each of the openings that is plated, so all the electrodes are connected to the bias power supply for plating. Subsequently, those connections are removed by etching bus bars between circuits that are used separately in the display. Finally, the requirement of an open aperture for light to pass through decreases the area available for pixel circuitry, current drivers, and shift registers so this display architecture is more suitable for large area displays where the pixel density is less than about 60 pixels per inch (ppi).

Figure 15:
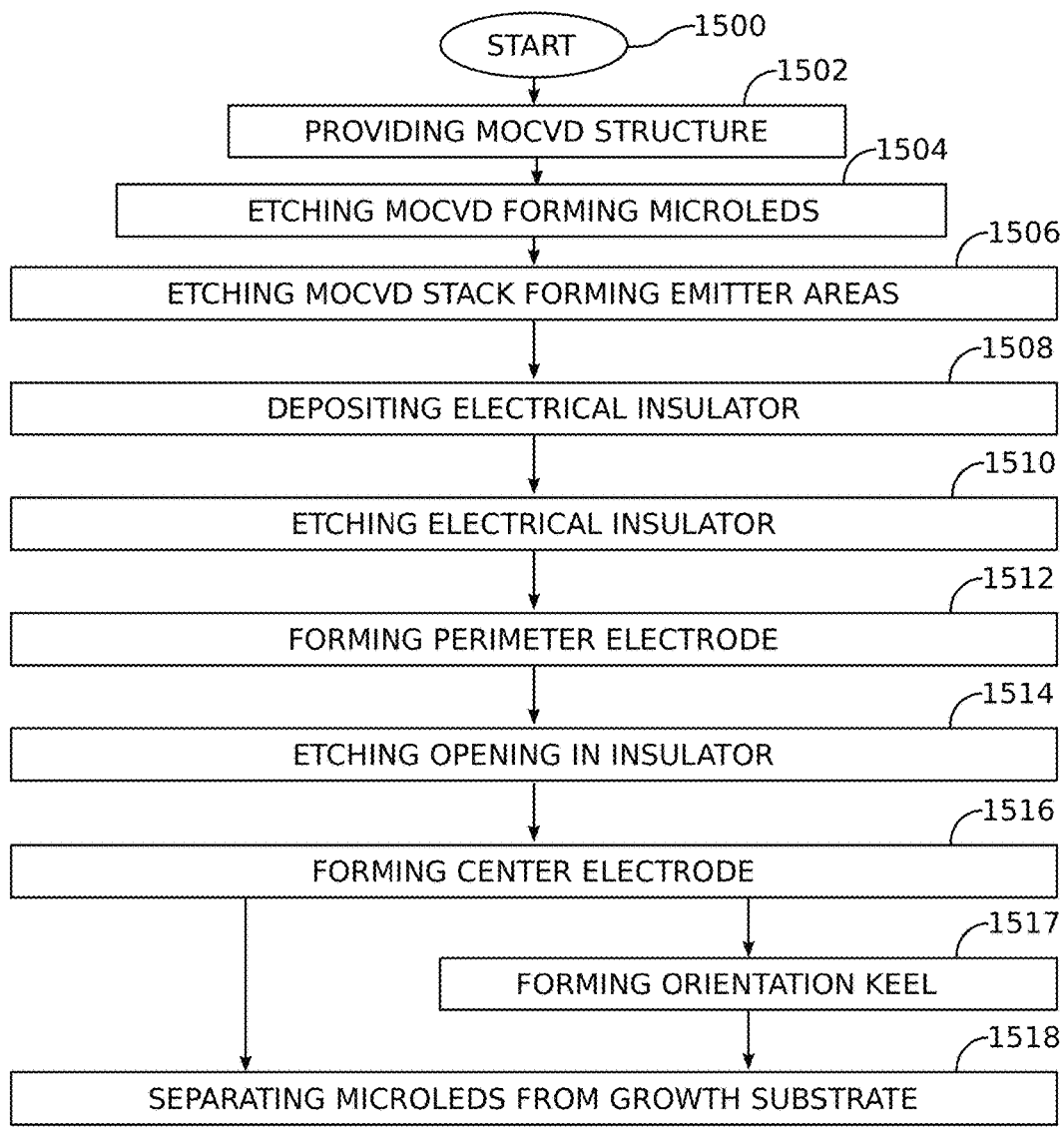
FIG. 15 is a flowchart illustrating a method for fabricating a back emission microLED.
Figure 4:
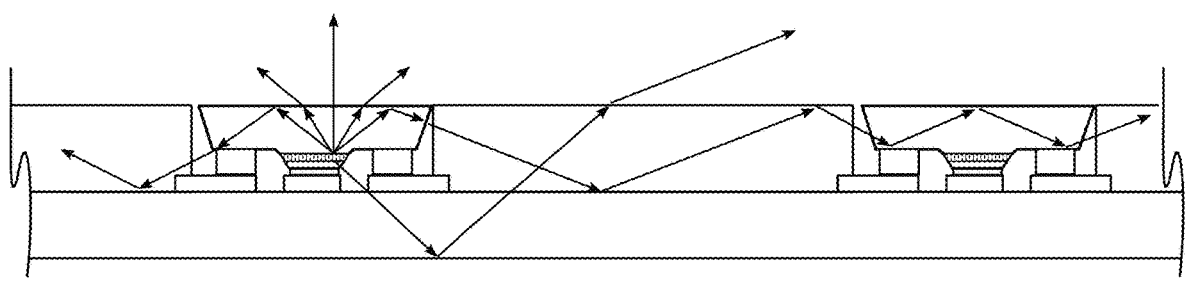
FIG. 4 is a partial cross-sectional view depicting a front emitting microLED structure made by fluidic assembly showing light escaping from a sub-pixel into the trap material (prior art).

FIG. 15 is a flowchart illustrating a method for fabricating a back emission micro-microLED. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1500.

Step 1502 provides a MOCVD structure comprising a first doped semiconductor overlying a growth substrate, with a top surface in a second plane, a multiple quantum well (MQW) layer overlying the first doped semiconductor having a top surface in a third plane, and a second doped semiconductor overlying the MQW layer and having a top surface in a fourth plane, where the first and second doped semiconductors are oppositely doped with n and p type dopants. Step 1504 etches the MOCVD structure to form a plurality of microLEDs. Step 1506 selectively etches a MOCVD stack to form emitting areas by removing regions of the second doped semiconductor and MQW layer, and partially removing regions of the first doped semiconductor to the level of a first plane, underlying the second plane. Depending on the design, the first doped semiconductor first plane is in the perimeter, the center of the first doped semiconductor layer, or both in the center and in a majority of the perimeter regions.

Step 1508 conformally deposits an electrical insulator overlying the MOCVD stack. Step 1510 selectively etches the electrical insulator overlying etched regions of the MOCVD stack creating a perimeter via. Step 1512 forms a perimeter electrode overlying the perimeter via having a substrate interface surface in a fifth plane. Step 1514 etches an opening in the electrical insulator, in the unetched regions of the MOCVD stack, creating a center via. Step 1516 forms a center electrode overlying the center via having a substrate interface surface in a sixth plane. The fifth plane may be coplanar, non-coplanar, or comprise planar segments and non-coplanar segments with respect to the sixth plane, depending on the design. Step 1518 separates the fabricated microLEDs from the growth substrate. In one aspect, Step 1517 forms an electrically conductive orientation keel overlying the second electrode.

Figure 16:
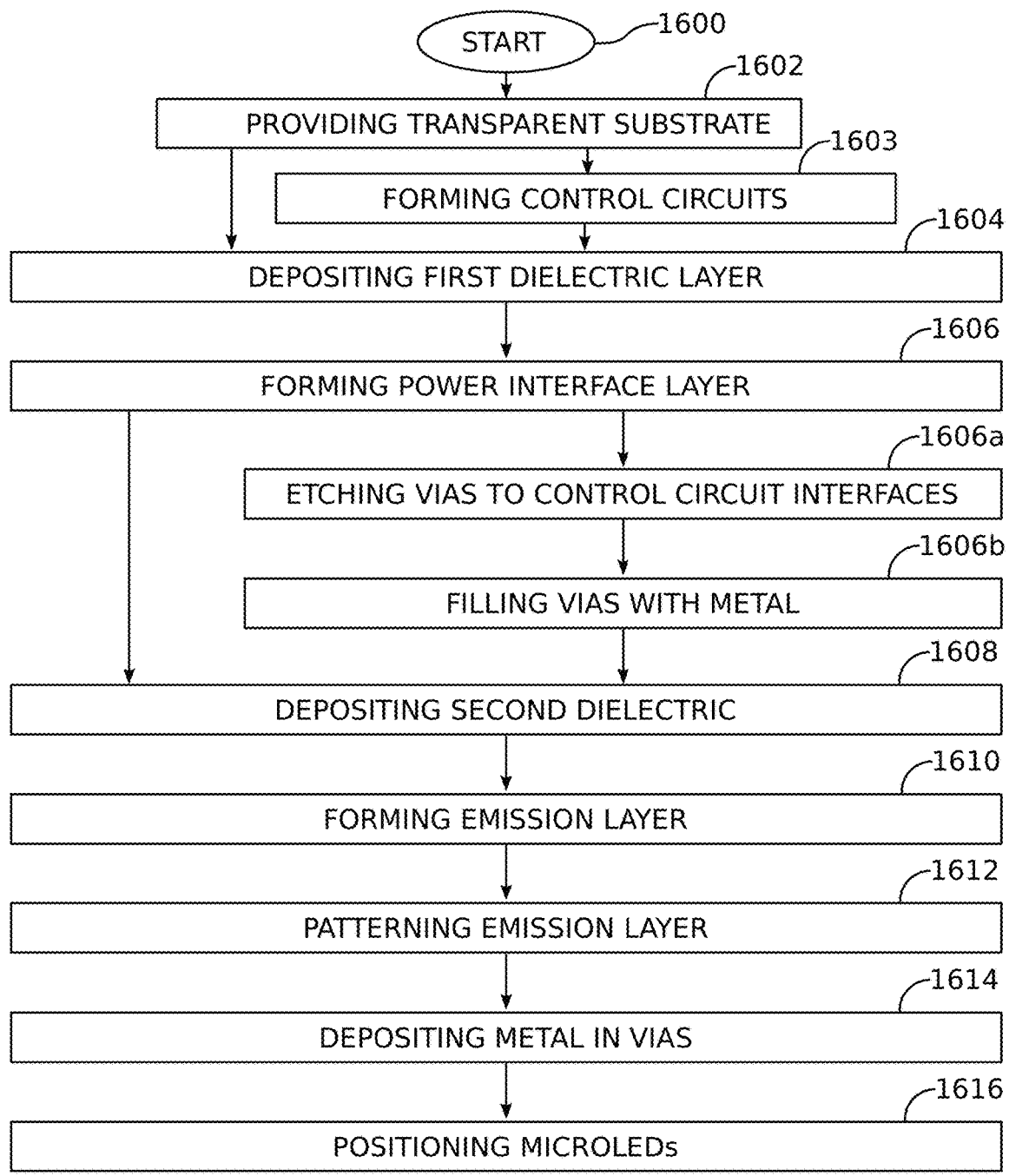
FIG. 16 is a flowchart illustrating a method for fabricating a back emission backplane.

FIG. 16 is a flowchart illustrating a method for fabricating a back emission backplane. The method starts at Step 1600. Step 1602 provides a transparent substrate with a top surface. Step 1604 deposits a first dielectric layer having a bottom surface overlying the substrate top surface. Step 1606 forms a power interface layer from the first dielectric layer, including electrically conductive row lines connected to first electrical contacts, electrically conductive column lines electrically connected to second electrical contacts, and apertures formed between the top surface and the bottom surface. Step 1608 deposits a second dielectric layer having a bottom surface overlying the power interface layer top surface. Step 1610 forms an emission layer from the second dielectric layer including a plurality of sub-pixel regions, forming each sub-pixel as follows. Step 1612 patterns the emission layer to form a well overlying a corresponding aperture, a first via overlying a corresponding first electrical contact, and a second via overlying a corresponding second electrical contact. Step 1614 deposits an electrically conductive metal in the first and second vias. Step 1616 positions back emission microLEDs with an emissive bottom surface interfacing a corresponding aperture. In one aspect, the microLEDs are positioned using a fluidic assembly process.

In one aspect, prior to depositing the first dielectric layer in Step 1604, for each sub-pixel Step 1603 forms a control circuit overlying the transparent substrate top surface, having a first electrical interface and a second electrical interface. Then, forming the power interface layer in Step 1606 includes the following substeps. Step 1606a etches a third via overlying the electrical control circuit first electrical interface and a fourth via overlying the electrical control circuit second electrical interface. Step 1606b fills the third via with an electrically conductive metal, forming the second electrical contact overlying the third via, and fills the fourth via with the electrically conductive metal, forming a power signal line overlying the fourth via.

In another aspect, patterning the emission layer in Step 1612 includes patterning the second via in a ring shape surrounding the well, and Step 1614 fills the second via ring with an optically reflective metal.

Figure 17:
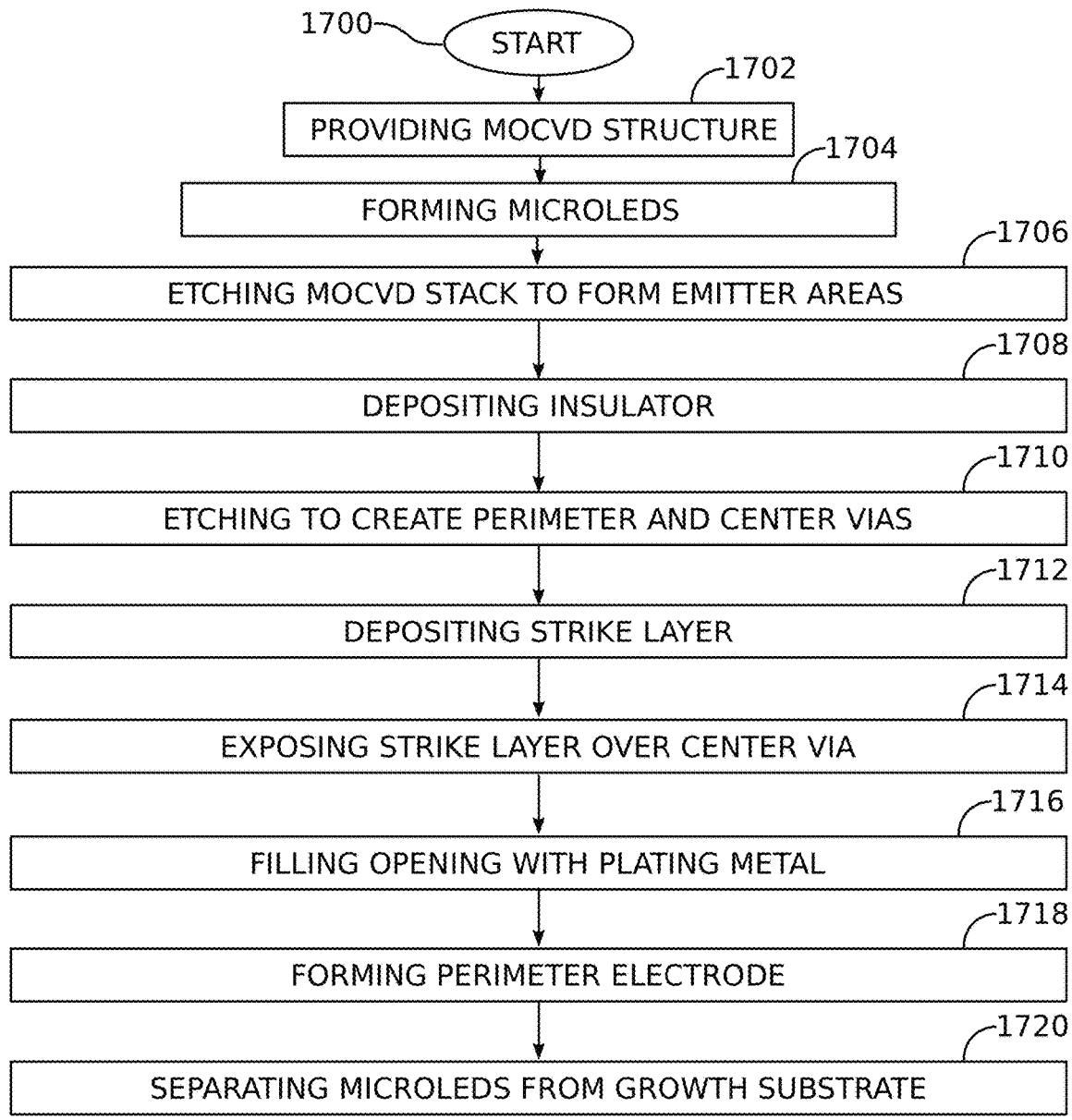
FIG. 17 is a flowchart illustrating an alternative method for fabricating a back emission microLED.

FIG. 17 is a flowchart illustrating an alternative method for fabricating a back emission microLED. The method begins at Step 1700. Step 1702 provides a MOCVD structure comprising a first doped semiconductor overlying a growth substrate, with a top surface in a second plane, a MQW layer overlying the first doped semiconductor having a top surface in a third plane, and a second doped semiconductor overlying the MQW layer and having a top surface in a fourth plane. The first and second doped semiconductors are oppositely doped with n and p type dopants. Step 1704 etches the MOCVD structure to form a plurality of microLEDs. Step 1706 selectively etches a MOCVD stack to form emitter areas by removing regions of the second doped semiconductor and MQW layer, and partially removing regions of the first doped semiconductor to the level of a first plane underlying the second plane.

Step 1708 conformally deposits an electrical insulator overlying the MOCVD stack. Step 1710 selectively etches the electrical insulator to create a perimeter via and a center via. Step 1712 conformally deposits a strike layer, forming a center electrode in a sixth plane overlying the center via. Step 1714 patterns an opening (in a resist layer) to expose the strike layer overlying the center via. Step 1716 fills the etched opening with metal (e.g., a plating solution) to form an electrically conductive orientation keel overlying the strike layer center electrode. Step 1718 forms a perimeter electrode having a substrate surface in a fifth plane overlying the perimeter via. Step 1720 separates the fabricated microLEDs from the growth substrate.

As described above, the first doped semiconductor first plane may be on the perimeter or the center of the first doped semiconductor layer, and the fifth plane may be coplanar, non-coplanar, or comprise coplanar segments and non-coplanar segments with respect to the sixth plane.

A system and method have been provided for back emission displays, backplanes, and LEDs. Examples of particular structures, processors, and hardware units have been presented to illustrate the invention. However, the invention is not limited to merely these examples. Other variations and embodiments of the invention will occur to those skilled in the art.

We claim:

1. A back emission micro-light emitting diode (microLED) comprising:
   a first semiconductor layer doped with a dopant selected from the dopant group consisting of n and p type dopants, the first doped semiconductor layer having a first top surface formed in a first plane and a second top surface formed in an overlying second plane, and having a bottom emission surface;
   a multiple quantum well (MQW) layer having a top surface formed in a third plane, overlying the first doped semiconductor second top surface;
   a second semiconductor doped with the unselected dopant type from the dopant group, formed as a layer having a top surface in a fourth plane, overlying the MQW layer;
   an electrical insulator overlying the top surface of the second doped semiconductor and the first top surface of the first doped semiconductor;
   a first electrode overlying and connected to the first doped semiconductor first top surface through a first via, and having a substrate interface surface in at least a fifth plane;
   a second electrode overlying and connected to the second doped semiconductor through a second via, and having a substrate interface surface in a sixth plane; and,
   an electrically conductive orientation keel overlying a center electrode selected from the group consisting of the first electrode or the second electrode.

2. The microLED of claim 1 wherein the first doped semiconductor second top surface is a region selected from the group consisting of the perimeter or the center of the first doped semiconductor layer.

3. The microLED of claim 1 wherein the alignment of the fifth plane is selected from the group consisting of coplanar with the sixth plane, non-coplanar with the sixth plane, or comprising coplanar segments and non-coplanar segments with respect to the sixth plane.

4. The microLED of claim 1 wherein the first and second doped semiconductors are doped gallium nitride (GaN).

5. The microLED of claim 1 wherein the first and second doped semiconductors are selected from the group consisting of doped gallium indium phosphide (GaInP) or doped gallium phosphide (GaP).

6. The microLED of claim 1 wherein the first doped semiconductor first top surface is in a perimeter region of the first doped semiconductor layer; and,
   the microLED further comprising:
   a plurality of first vias connected to the first doped semiconductor.

7. The microLED of claim 1 wherein the first doped semiconductor second top surface is in a perimeter region of the first doped semiconductor layer; and, the microLED further comprising:
   a plurality of second vias connected to the second doped semiconductor.

8. The microLED of claim 1 further comprising:
   a titanium (Ti) strike layer interposed between the second electrode and the orientation keel; and,
   wherein the orientation keel is copper (Cu).

9. A back emission display backplane comprising:
   a transparent substrate with a top surface;
   a power interface layer having a bottom surface overlying the substrate top surface, a top surface with a plurality of first electrical contacts and a plurality of second electrical contacts, and a plurality of apertures, each aperture formed with a top surface adjacent to the transparent substrate and the bottom surface adjacent to an emission layer; and,
   the emission layer having a bottom surface overlying the power interface layer top surface and comprising a plurality of sub-pixel regions, each sub-pixel region comprising a well overlying a corresponding aperture, a first conductive via electrically connected to a corresponding first electrical contact, and a second conductive via electrically connected to a corresponding second electrical contact.

10. The backplane of claim 9 wherein the power interface layer further comprises:
    a plurality of control circuits, each control circuit having a first interface electrically connected to a corresponding second electrical contact, and a second interface;
    an electrically conductive power signal line formed in the power interface layer top surface and electrically connected to the control circuit second interface; and,
    an electrically conductive column line formed in the power interface layer top surface and electrically connected to a first electrical contact.

11. The backplane of claim 10 wherein the control circuit comprises a plurality of thin film transistors (TFTs) configured to accept a supply voltage from the power signal interface and to supply a controlled current.

12. The backplane of claim 9 wherein each first conductive via in the emissive layer is formed as a ring overlying a corresponding first electrical contact.

13. The backplane of claim 12 wherein the first conductive via ring has an optically reflective interior surface.

14. The backplane of claim 12 wherein the first conductive via ring is copper (Cu) with a silver (Ag) interior surface.

15. The backplane of claim 9 wherein each sub-pixel region comprises a plurality of wells overlying corresponding apertures, for each well a first conductive via electrically connected to corresponding first electrical contact, and a second conductive via electrically connected to corresponding second electrical contact.

16. A back emission display comprising:
    a transparent substrate with a top surface;
    a power interface layer having a bottom surface overlying the substrate top surface, a top surface with a plurality of first electrical contacts and a plurality of second electrical contacts, and a plurality of apertures, each aperture formed with a top surface adjacent to the transparent substrate and the bottom surface adjacent to an emission layer;
    the emission layer having a bottom surface overlying the power interface layer top surface comprising a plurality of sub-pixel regions, each sub-pixel region comprising a well overlying a corresponding aperture, a first conductive via electrically connected to a corresponding first electrical contact, and a second conductive via electrically connected to a corresponding second electrical contact;
a back emission micro-light emitting diode (microLED) occupying each well, having an emissive bottom surface overlying a corresponding aperture, a first electrode formed on a microLED top surface, and a second electrode formed on the microLED top surface;
a first electrical interconnect formed on an emission layer top surface electrically connecting each first conductive via to a corresponding microLED first electrode;
an insulating layer overlying the emission layer top surface and comprising a third conductive via electrically connected to a corresponding second conductive via on the emission layer top surface and a fourth conductive via electrically connected to a corresponding microLED second electrode; and,
a second electrical interconnect formed on an insulating layer top surface electrically connecting each third conductive via to a corresponding fourth conductive via.

17. The display of claim 16 wherein each microLED further comprises an electrically conductive orientation keel electrically connected to, and overlying the second electrode; and,
wherein the fourth conductive via is the orientation keel.

18. The display of claim 16 wherein the power interface layer further comprises:
a plurality of electrical control circuits, each electrical control circuit having a first interface electrically connected to a corresponding second electrical contact, and a second interface; and,
an electrically conductive power signal line formed in the power interface layer top surface and electrically connected to the control circuit second interface; and,
an electrical conductive column line formed in the power interface layer top surface and electrically connected to a first electrical contact.

19. The display of claim 18 wherein the control circuit comprises a plurality of thin film transistors (TFTs) configured to accept a supply voltage from the power signal interface and to supply a controlled current.

20. The display of claim 16 wherein each first conductive via in the emissive layer is formed as a ring surrounding the well and overlying a corresponding first electrical contact.

21. The display of claim 20 wherein the first conductive via ring has an optically reflective interior surface.

22. The display of claim 16 wherein each sub-pixel region comprises a plurality of wells overlying corresponding apertures, for each well a first conductive via electrically connected to corresponding first electrical contact, and a second conductive via electrically connected to corresponding second electrical contact.

23. A method for fabricating a back emission micro light emitting diode (microLED), the method comprising:
providing a metalorganic chemical vapor deposition (MOCVD) structure comprising a first doped semiconductor overlying a growth substrate, with a top surface in a second plane, a multiple quantum well (MQW) layer overlying the first doped semiconductor having a top surface in a third plane, and a second doped semiconductor overlying the MQW layer and having a top surface in a fourth plane, where the first and second doped semiconductors are oppositely doped with n and p type dop ants;
etching the MOCVD structure to form a plurality of microLEDs;
selectively etching a MOCVD stack to form emitter areas by removing regions of the second doped semiconductor and MQW layer, and partially removing regions of the first doped semiconductor to the level of a first plane underlying the second plane;
conformally depositing an electrical insulator overlying the MOCVD stack;
selectively etching the electrical insulator overlying the etched regions of the MOCVD stack creating a perimeter via;
forming a perimeter electrode having a ring shape overlying the first via and having a substrate interface surface in at least a fifth plane;
etching an opening in the electrical insulator in the unetched regions of the MOCVD stack, creating a center via;
forming a center electrode overlying the center via, at least partially surrounded by the perimeter electrode, and having a substrate interface surface in a sixth plane; and,
separating the fabricated microLEDs from the growth substrate.

24. The method of claim 23 further comprising:
forming an electrically conductive orientation keel overlying the center electrode.

25. The method of claim 23 wherein selectively etching the MOCVD stack includes the first doped semiconductor first plane being in a region selected from the group consisting of the perimeter, the center, or both the center and portions of the perimeter of the first doped semiconductor layer.

26. The method of claim 23 wherein the fifth plane is in an alignment selected from the group consisting of coplanar with the sixth plane, non-coplanar with the sixth plane, or comprising coplanar segments and non-coplanar segments with respect to the sixth plane.

27. A method for fabricating a back emission backplane, the method comprising:
providing a transparent substrate with a top surface;
depositing a first dielectric layer having a bottom surface overlying the substrate top surface;
forming a power interface layer from the first dielectric layer, including a first plurality of first electrical contacts, a first plurality of second electrical contacts, and a first plurality of apertures, each aperture formed with a top surface adjacent to the transparent substrate and a bottom surface adjacent to a second dielectric layer;
depositing the second dielectric layer having the bottom surface overlying the power interface layer top surface;
forming an emission layer from the second dielectric layer including a first plurality of sub-pixel regions, forming each sub-pixel as follows:
patterning the emission layer to form a well overlying a corresponding aperture, a first via overlying a corresponding first electrical contact, and a second via overlying a corresponding second electrical contact;
depositing an electrically conductive metal in the emission layer first and second vias; and,
positioning back emission micro-light emitting diodes (microLEDs) with an emissive bottom surface interfacing a corresponding aperture.

28. The method of claim 27 further comprising:
prior to depositing the first dielectric layer, for each sub-pixel, forming a control circuit overlying the transparent substrate top surface, having a first electrical interface and a second electrical interface;

wherein forming the power interface layer includes:
    etching a third via overlying the electrical control circuit first electrical interface and a fourth via overlying the electrical control circuit second electrical interface;
    filling the third via with an electrically conductive metal and forming the second electrical contact overlying the third via, and filling the fourth via with the electrically conductive metal and forming a power signal line overlying the fourth via.

29. The method of claim 27 wherein patterning the emission layer includes patterning the second via in a ring shape surrounding the well; and,
    wherein depositing metal in the emission layer vias includes filling the second via ring with an optically reflective metal.

30. The method of claim 27 wherein positioning the back emission microLEDs includes positioning microLEDs with orientation keels using a fluidic assembly process.

31. A method for fabricating a back emission micro light emitting diode (microLED), the method comprising:
    providing a metalorganic chemical vapor deposition (MOCVD) structure comprising a first doped semiconductor overlying a growth substrate, with a top surface in a second plane, a multiple quantum well (MQW) layer overlying the first doped semiconductor having a top surface in a third plane, and a second doped semiconductor overlying the MQW layer and having a top surface in a fourth plane, where the first and second doped semiconductors are oppositely doped with n and p type dopants;
    etching the MOCVD structure to form a plurality of microLEDs;
    selectively etching a MOCVD stack to form emitter areas by removing regions of the second doped semiconductor and MQW layer, and partially removing regions of the first doped semiconductor to the level of a first plane underlying the second plane;
    conformally depositing an electrical insulator overlying the MOCVD stack;
    selectively etching the electrical insulator creating a perimeter via and a center via;
    conformally depositing a strike layer, forming a center electrode in a sixth plane overlying the center via;
    etching openings to expose the strike layer overlying the center via;
    filling the etched opening with metal to form an electrically conductive orientation keel overlying the strike layer center electrode;
    forming a perimeter electrode have a substrate surface in at least a fifth plane overlying the first via; and,
    separating the fabricated microLEDs from the growth substrate.

32. The method of claim 31 wherein selectively etching the MOCVD stack includes the first doped semiconductor first plane being in a region selected from the group consisting of the perimeter, the center, or both the center and portions of the perimeter of the first doped semiconductor layer.

33. The method of claim 31 wherein the fifth plane is in an orientation selected from the group consisting of coplanar with the sixth plane, non-coplanar with the sixth plane, or comprising coplanar segments and non-coplanar segments with respect to the sixth plane.

34. A back emission micro-light emitting diode (microLED) comprising:
    a first semiconductor layer doped with a dopant selected from the dopant group consisting of n and p type dopants, the first doped semiconductor layer having a first top surface formed in a first plane and a second top surface formed in an overlying second plane, and having a bottom emission surface;
    a multiple quantum well (MQW) layer having a top surface formed in a third plane, overlying the first doped semiconductor second top surface;
    a second semiconductor doped with the unselected dopant type from the dopant group, formed as a layer having a top surface in a fourth plane, overlying the MQW layer;
    an electrical insulator overlying the top surface of the second doped semiconductor and the first top surface of the first doped semiconductor;
    a first electrode overlying and connected to the first doped semiconductor first top surface through a first via, and having a substrate interface surface in at least a fifth plane;
    a second electrode overlying and connected to the second doped semiconductor through a second via, and having a substrate interface surface in a sixth plane; and,
    wherein an electrode selected from the group consisting of the first electrode and the second electrode is formed as a ring at least partially surrounding an unselected electrode.

35. A back emission display comprising:
    a transparent substrate with a top surface;
    a power interface layer having a bottom surface overlying the substrate top surface, a top surface with a plurality of first electrical contacts and a plurality of second electrical contacts, and a plurality of apertures formed between a top surface and the bottom surface;
    an emission layer having a bottom surface overlying the power interface layer top surface comprising a plurality of sub-pixel regions, each sub-pixel region comprising a well overlying a corresponding aperture, a first conductive via electrically connected to a corresponding first electrical contact, and a second conductive via electrically connected to a corresponding second electrical contact;
    a back emission micro-light emitting diode (microLED) occupying each well, having an emissive bottom surface overlying a corresponding aperture, a first electrode formed on a microLED top surface, and a second electrode formed on the microLED top surface;
    a first electrical interconnect formed on an emission layer top surface electrically connecting each first conductive via to a corresponding microLED first electrode;
    an insulating layer overlying the emission layer top surface and comprising a third conductive via electrically connected to a corresponding second conductive via on the emission layer top surface and a fourth conductive via electrically connected to a corresponding microLED second electrode;
    a second electrical interconnect formed on an insulating layer top surface electrically connecting each third conductive via to a corresponding fourth conductive via;
    wherein each microLED further comprises an electrically conductive orientation keel electrically connected to, and overlying the second electrode; and,
    wherein the fourth conductive via is the orientation keel.

36. A back emission display backplane comprising:
    a transparent substrate with a top surface;

a power interface layer having a bottom surface overlying the substrate top surface, a top surface with a plurality of first electrical contacts and a plurality of second electrical contacts, and a plurality of apertures formed between a top surface and the bottom surface;

an emission layer having a bottom surface overlying the power interface layer top surface and comprising a plurality of sub-pixel regions, each sub-pixel region comprising a well overlying a corresponding aperture, a first conductive via electrically connected to a corresponding first electrical contact, and a second conductive via electrically connected to a corresponding second electrical contact; and, wherein each first conductive via in the emissive layer is formed as a ring overlying a corresponding first electrical contact.

37. A back emission display comprising:

a transparent substrate with a top surface;

a power interface layer having a bottom surface overlying the substrate top surface, a top surface with a plurality of first electrical contacts and a plurality of second electrical contacts, and a plurality of apertures formed between a top surface and the bottom surface;

an emission layer having a bottom surface overlying the power interface layer top surface comprising a plurality of sub-pixel regions, each sub-pixel region comprising a well overlying a corresponding aperture, a first conductive via electrically connected to a corresponding first electrical contact, and a second conductive via electrically connected to a corresponding second electrical contact;

a back emission micro-light emitting diode (microLED) occupying each well, having an emissive bottom surface overlying a corresponding aperture, a first electrode formed on a microLED top surface, and a second electrode formed on the microLED top surface;

a first electrical interconnect formed on an emission layer top surface electrically connecting each first conductive via to a corresponding microLED first electrode;

an insulating layer overlying the emission layer top surface and comprising a third conductive via electrically connected to a corresponding second conductive via on the emission layer top surface and a fourth conductive via electrically connected to a corresponding microLED second electrode;

a second electrical interconnect formed on an insulating layer top surface electrically connecting each third conductive via to a corresponding fourth conductive via; and, wherein each first conductive via in the emissive layer is formed as a ring surrounding the well and overlying a corresponding first electrical contact.

38. A method for fabricating a back emission micro light emitting diode (microLED), the method comprising:

providing a metalorganic chemical vapor deposition (MOCVD) structure comprising a first doped semiconductor overlying a growth substrate, with a top surface in a second plane, a multiple quantum well (MQW) layer overlying the first doped semiconductor having a top surface in a third plane, and a second doped semiconductor overlying the MQW layer and having a top surface in a fourth plane, where the first and second doped semiconductors are oppositely doped with n and p type dop ants;

etching the MOCVD structure to form a plurality of microLEDs;

selectively etching a MOCVD stack to form emitter areas by removing regions of the second doped semiconductor and MQW layer, and partially removing regions of the first doped semiconductor to the level of a first plane underlying the second plane;

conformally depositing an electrical insulator overlying the MOCVD stack;

selectively etching the electrical insulator overlying the etched regions of the MOCVD stack creating a perimeter via;

forming a perimeter electrode overlying the first via having a substrate interface surface in at least a fifth plane;

etching an opening in the electrical insulator in the unetched regions of the MOCVD stack, creating a center via;

forming a center electrode overlying the center via, having a substrate interface surface in a sixth plane;

forming an electrically conductive orientation keel overlying the center electrode; and, separating the fabricated microLEDs from the growth substrate.

39. A method for fabricating a back emission backplane, the method comprising:

providing a transparent substrate with a top surface;

for each sub-pixel, forming a control circuit overlying the transparent substrate top surface, having a first electrical interface and a second electrical interface;

depositing a first dielectric layer having a bottom surface overlying the substrate top surface;

forming a power interface layer from the first dielectric layer, including a first plurality of first electrical contacts, a first plurality of second electrical contacts, and a first plurality of apertures formed between the top surface and the bottom surface;

depositing a second dielectric layer having a bottom surface overlying the power interface layer top surface;

forming an emission layer from the second dielectric layer including a first plurality of sub-pixel regions, forming each sub-pixel as follows:

patterning the emission layer to form a well overlying a corresponding aperture, a first via overlying a corresponding first electrical contact, and a second via overlying a corresponding second electrical contact;

depositing an electrically conductive metal in the emission layer first and second vias;

positioning back emission micro-light emitting diodes (microLEDs) with an emissive bottom surface interfacing a corresponding aperture;

wherein forming the power interface layer includes:

etching a third via overlying the electrical control circuit first electrical interface and a fourth via overlying the electrical control circuit second electrical interface; and, filling the third via with an electrically conductive metal and forming the second electrical contact overlying the third via, and filling the fourth via with the electrically conductive metal and forming a power signal line overlying the fourth via.

40. A method for fabricating a back emission backplane, the method comprising:

providing a transparent substrate with a top surface;

depositing a first dielectric layer having a bottom surface overlying the substrate top surface;

forming a power interface layer from the first dielectric layer, including a first plurality of first electrical contacts, a first plurality of second electrical contacts, and a first plurality of apertures formed between the top surface and the bottom surface;

depositing a second dielectric layer having a bottom surface overlying the power interface layer top surface;

forming an emission layer from the second dielectric layer including a first plurality of sub-pixel regions, forming each sub-pixel as follows:

patterning the emission layer to form a well overlying a corresponding aperture, a first via overlying a corresponding first electrical contact, and a second via overlying a corresponding second electrical contact;

depositing an electrically conductive metal in the emission layer first and second vias;

positioning back emission micro-light emitting diodes (microLEDs) with an emissive bottom surface interfacing a corresponding aperture;

wherein patterning the emission layer includes patterning the second via in a ring shape surrounding the well; and, wherein depositing metal in the emission layer vias includes filling the second via ring with an optically reflective metal.

41. A method for fabricating a back emission backplane, the method comprising:

providing a transparent substrate with a top surface;

depositing a first dielectric layer having a bottom surface overlying the substrate top surface;

forming a power interface layer from the first dielectric layer, including a first plurality of first electrical contacts, a first plurality of second electrical contacts, and a first plurality of apertures formed between the top surface and the bottom surface;

depositing a second dielectric layer having a bottom surface overlying the power interface layer top surface;

forming an emission layer from the second dielectric layer including a first plurality of sub-pixel regions, forming each sub-pixel as follows:

patterning the emission layer to form a well overlying a corresponding aperture, a first via overlying a corresponding first electrical contact, and a second via overlying a corresponding second electrical contact;

depositing an electrically conductive metal in the emission layer first and second vias;

positioning back emission micro-light emitting diodes (microLEDs) with an emissive bottom surface interfacing a corresponding aperture; and, wherein positioning the back emission microLEDs includes positioning microLEDs with orientation keels using a fluidic assembly process.

42. A back emission display backplane comprising:

a transparent substrate with a top surface;

a power interface layer having a bottom surface overlying the substrate top surface, a top surface with a plurality of first electrical contacts and a plurality of second electrical contacts, and a plurality of apertures formed between a top surface and the bottom surface;

an emission layer having a bottom surface overlying the power interface layer top surface and comprising a plurality of sub-pixel regions, each sub-pixel region comprising a well overlying a corresponding aperture, a first conductive via electrically connected to a corresponding first electrical contact, and a second conductive via electrically connected to a corresponding second electrical contact;

wherein the power interface layer further comprises:

a plurality of control circuits, each control circuit having a first interface electrically connected to a corresponding second electrical contact, and a second interface;

an electrically conductive power signal line formed in the power interface layer top surface and electrically connected to the control circuit second interface; and, an electrically conductive column line formed in the power interface layer top surface and electrically connected to a first electrical contact.

* * * * *